(12) United States Patent
Pan et al.

(10) Patent No.: US 10,516,030 B2
(45) Date of Patent: Dec. 24, 2019

(54) CONTACT PLUGS AND METHODS FORMING SAME

(71) Applicant: Taiwan Semiconductor Manufacturing Company, Ltd., Hsinchu (TW)

(72) Inventors: Kuo-Hua Pan, Hsinchu (TW); Je-Wei Hsu, Hsinchu (TW); Hua Feng Chen, Hsinchu (TW); Jyun-Ming Lin, Hsinchu (TW); Chen-Huang Peng, Hsinchu (TW); Min-Yann Hsieh, Kaohsiung (TW); Java Wu, Taoyuan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 15/610,981

(22) Filed: Jun. 1, 2017

(65) Prior Publication Data

US 2018/0197970 A1   Jul. 12, 2018

Related U.S. Application Data

(60) Provisional application No. 62/443,885, filed on Jan. 9, 2017.

(51) Int. Cl.
*H01L 21/311* (2006.01)
*H01L 21/768* (2006.01)
(Continued)

(52) U.S. Cl.
CPC ...... *H01L 29/665* (2013.01); *H01L 21/31144* (2013.01); *H01L 21/76831* (2013.01);
(Continued)

(58) Field of Classification Search
None
See application file for complete search history.

(56) References Cited

U.S. PATENT DOCUMENTS 6,087,705 A    7/2000 Gardner et al.
8,486,789 B2   7/2013 Okazaki
(Continued)

FOREIGN PATENT DOCUMENTS

KR    20050039088 A    4/2005
KR    20080076832 A    8/2008
(Continued)

*Primary Examiner* — Jay C Chang
(74) *Attorney, Agent, or Firm* — Slater Matsil, LLP

(57) ABSTRACT

A method includes forming a transistor, which includes forming a dummy gate stack over a semiconductor region, and forming an Inter-Layer Dielectric (ILD). The dummy gate stack is in the ILD, and the ILD covers a source/drain region in the semiconductor region. The method further includes removing the dummy gate stack to form a trench in the first ILD, forming a low-k gate spacer in the trench, forming a replacement gate dielectric extending into the trench, forming a metal layer to fill the trench, and performing a planarization to remove excess portions of the replacement gate dielectric and the metal layer to form a gate dielectric and a metal gate, respectively. A source region and a drain region are then formed on opposite sides of the metal gate.

20 Claims, 23 Drawing Sheets

(51) Int. Cl.
　　　*H01L 21/285*　　(2006.01)
　　　*H01L 29/66*　　(2006.01)
　　　*H01L 29/08*　　(2006.01)
　　　*H01L 29/78*　　(2006.01)
　　　*H01L 29/45*　　(2006.01)
　　　*H01L 29/417*　　(2006.01)
　　　*H01L 23/485*　　(2006.01)

(52) U.S. Cl.
　　　CPC ........ *H01L 23/485* (2013.01); *H01L 29/0847* (2013.01); *H01L 29/41791* (2013.01); *H01L 29/45* (2013.01); *H01L 29/6656* (2013.01); *H01L 29/66545* (2013.01); *H01L 29/66795* (2013.01); *H01L 29/7851* (2013.01); *H01L 21/28518* (2013.01)

(56) References Cited

U.S. PATENT DOCUMENTS

| | | | |
|---|---|---|---|
| 8,624,324 B1* | 1/2014 | Chen | H01L 21/76895 257/288 |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 9,786,764 B2 | 10/2017 | Park et al. | |
| 9,917,173 B2 | 3/2018 | Liu et al. | |
| 2010/0155846 A1 | 6/2010 | Mukherjee et al. | |
| 2013/0248985 A1* | 9/2013 | Amamath | H01L 29/66545 257/330 |
| 2015/0072511 A1* | 3/2015 | Liu | H01L 29/66545 438/586 |
| 2015/0115375 A1* | 4/2015 | Yoo | H01L 29/517 257/411 |
| 2015/0235956 A1* | 8/2015 | Lin | H01L 23/53266 257/757 |
| 2015/0348911 A1* | 12/2015 | Xiao | H01L 23/53276 257/751 |
| 2015/0380305 A1* | 12/2015 | Basker | H01L 21/76846 257/77 |
| 2016/0086802 A1 | 3/2016 | Hong et al. | |
| 2016/0099216 A1 | 4/2016 | Lin et al. | |
| 2016/0141417 A1* | 5/2016 | Park | H01L 29/66545 257/365 |
| 2016/0372472 A1 | 12/2016 | Kim | |
| 2017/0200808 A1 | 7/2017 | Zhang et al. | |

FOREIGN PATENT DOCUMENTS

| | | |
|---|---|---|
| KR | 20160024891 A | 3/2016 |
| KR | 20160059862 A | 5/2016 |

\* cited by examiner

CONTACT PLUGS AND METHODS FORMING SAME

PRIORITY CLAIM AND CROSS-REFERENCE

This application claims the benefit of the following provisionally filed U.S. Patent application: Application Ser. No. 62/443,885, filed on Jan. 9, 2017, and entitled "Contact Plugs and Methods Forming Same;" which application is hereby incorporated herein by reference.

BACKGROUND

In the recent development of transistors, metal are used for forming contact plugs and metal gates. Contact plugs are used for connecting to the source and drain regions and the gates of transistors. The source/drain contact plugs are typically connected to source/drain silicide regions, which are formed by depositing a metal layer, and then performing an anneal to react the metal layer with the silicon in the source/drain regions. The gate contact plugs are used for connecting to the metal gates.

The formation of metal gates may include forming dummy gate stacks, removing the dummy gate stacks to form openings, filling a metallic material into the openings, and performing a planarization to remove excess metallic material in order to form the metal gates. The metal gates are then recessed to form recesses, and dielectric hard masks are filled into the recesses. When the gate contact plugs are formed, the hard masks are removed, so that the gate contact plugs may contact the metal gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
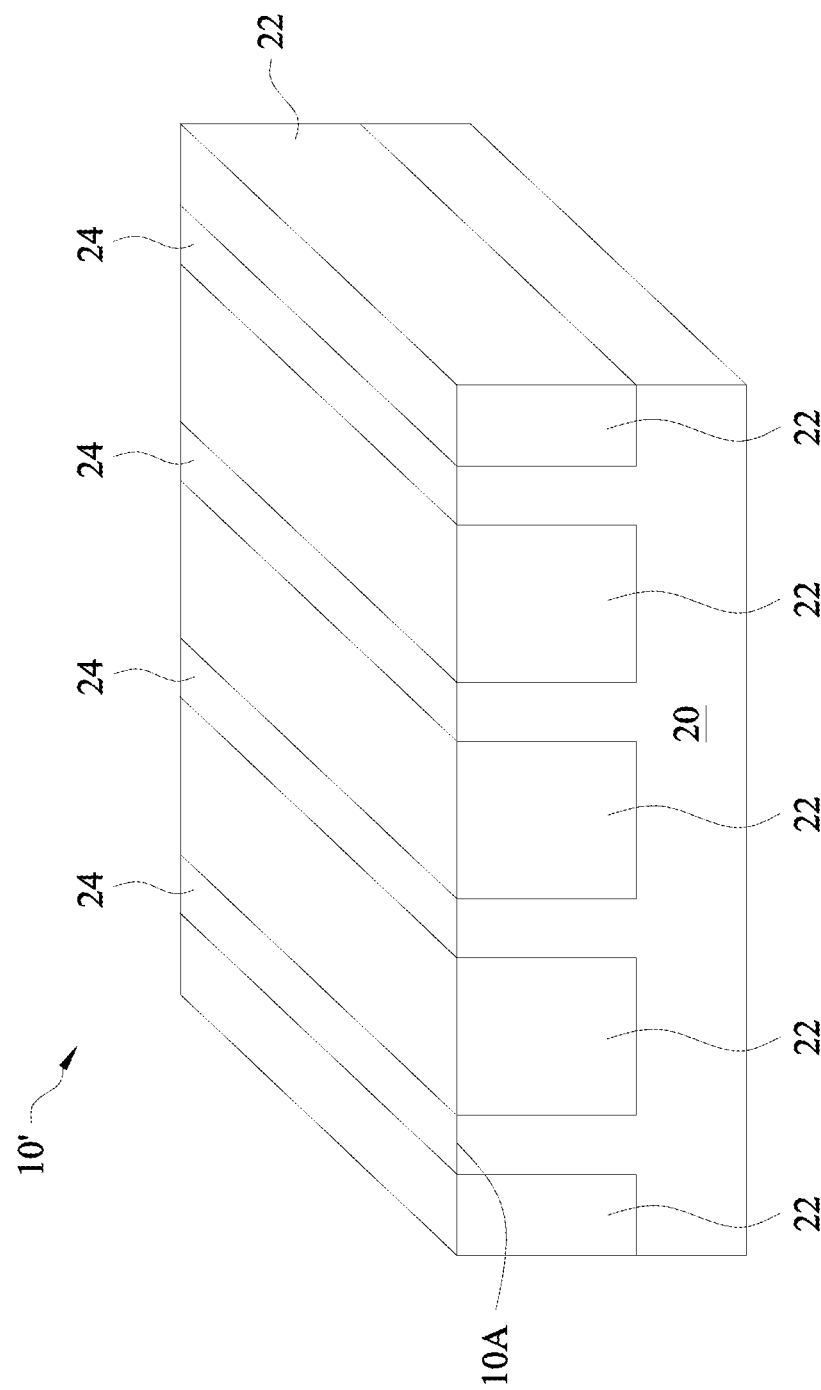
FIGS. 1 through 21 are perspective views and cross-sectional views of intermediate stages in the formation of a transistor in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistor and the methods of forming the same are provided in accordance with various exemplary embodiments. The intermediate stages of forming the transistors are illustrated in accordance with some embodiments. Some variations of some embodiments are discussed. Throughout the various views and illustrative embodiments, like reference numbers are used to designate like elements. In the illustrated exemplary embodiments, the formation of Fin Field-Effect Transistors (FinFETs) is used as an example to explain the concepts of the present disclosure. Planar transistors may also adopt the concept of the present disclosure.

FIGS. 1 through 21 illustrate the cross-sectional views and perspective views of intermediate stages in the formation of FinFETs in accordance with some embodiments of the present disclosure. The steps shown in FIGS. 1 through 21 are also reflected schematically in the process flow shown in FIG. 22.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20, wherein the top surface of substrate 20 is a major surface 10A of wafer 10. The portions of substrate 20 between neighboring STI regions 22 are referred to as semiconductor strips 24. The top surfaces of semiconductor strips 24 and the top surfaces of STI regions 22 may be substantially level with each other in accordance with some exemplary embodiments.

STI regions 22 may include a liner oxide (not shown), which may be a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed using Flowable Chemical Vapor Deposition (FCVD), spin-on, or the like.

Figure 2:
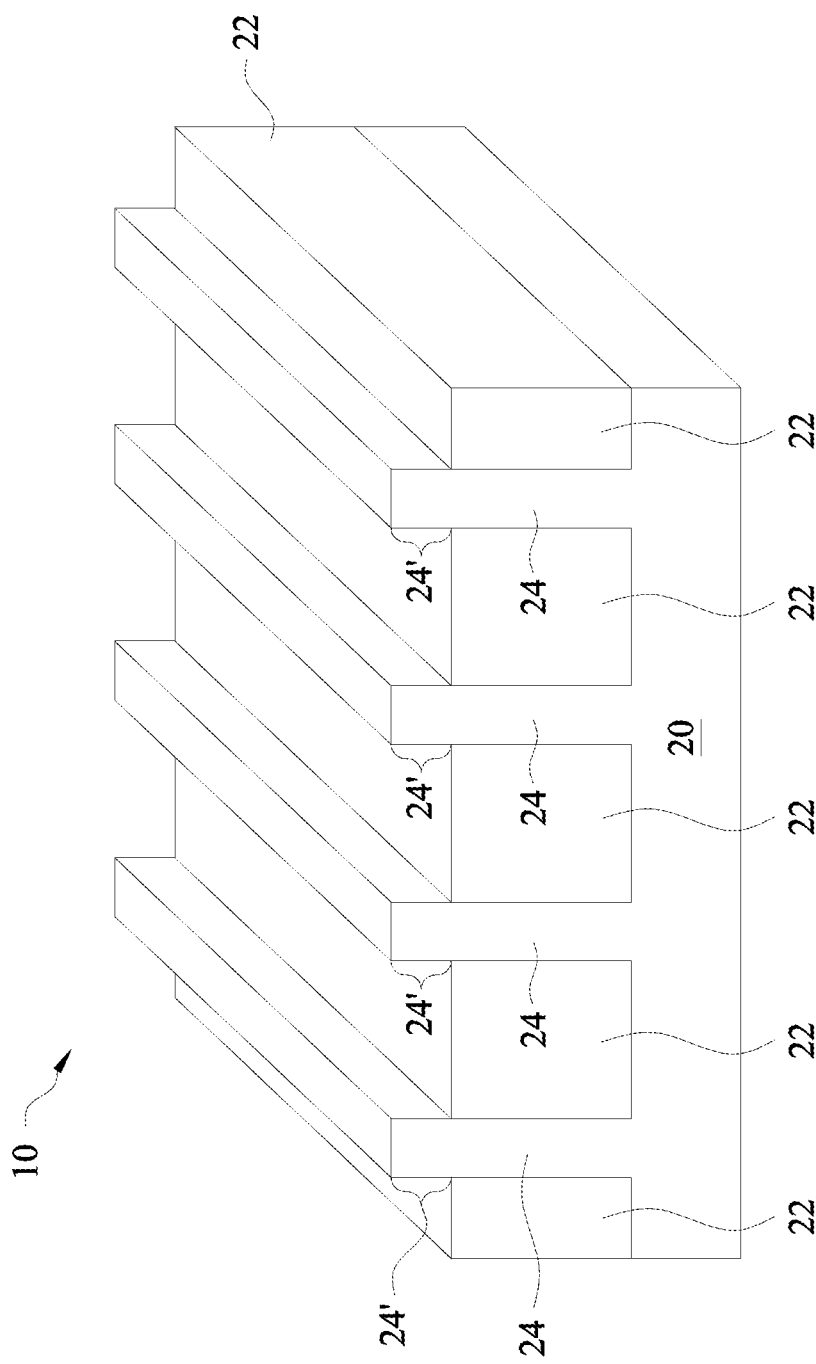

Referring to FIG. 2, STI regions 22 are recessed, so that the top portions of semiconductor strips 24 protrude higher than the top surfaces of STI regions 22 to form protruding fins 24'. The etching may be performed using a dry etching process, wherein $HF_3$ and $NH_3$ are used as the etching gases. During the etching process, plasma may be generated. Argon may also be included. In accordance with alternative embodiments of the present disclosure, the recessing of STI regions 22 is performed using a wet etch process. The etching chemical may include HF, for example.

Figure 3:
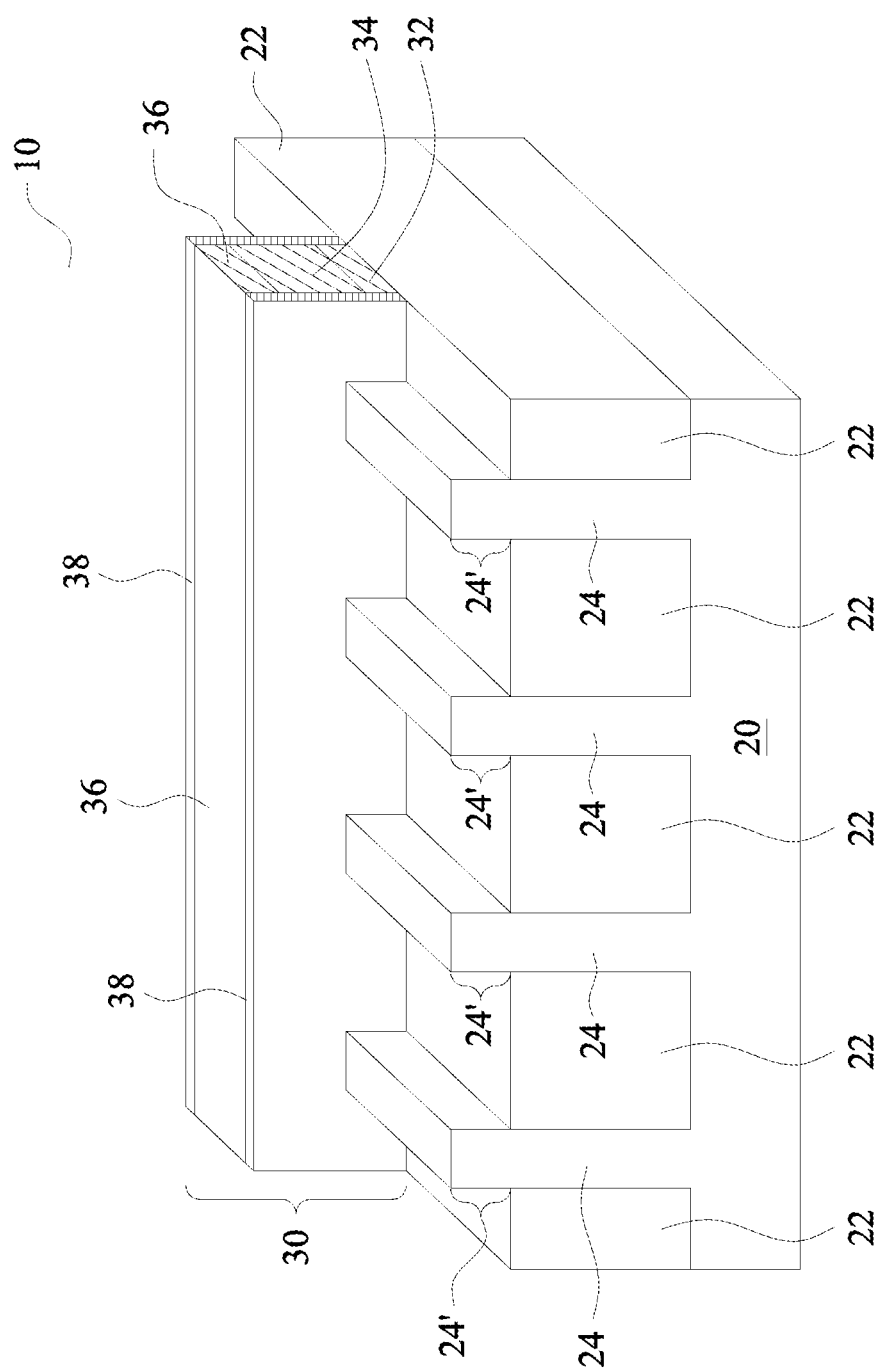

Referring to FIG. 3, dummy gate stack 30 is formed on the top surfaces and the sidewalls of (protruding) fins 24'. It is appreciated that although one dummy gate stack 30 is illustrated for clarity, there may be a plurality of dummy gate stacks formed, which are parallel to each other, with the plurality of dummy gate stacks crossing the same semiconductor fin(s) 24'. Dummy gate stack 30 may include dummy gate dielectric 32 and dummy gate electrode 34 over dummy gate dielectric 32. Dummy gate electrode 34 may be formed, for example, using polysilicon, and other materials may also be used. Dummy gate stack 30 may also include one (or a plurality of) hard mask layer 36 over dummy gate electrode 34. Hard mask layer 36 may be formed of silicon nitride, silicon carbo-nitride, or the like. Dummy gate stack 30 may cross over a single one or a plurality of protruding fins 24' and/or STI regions 22. Dummy gate stack 30 also has a lengthwise direction perpendicular to the lengthwise directions of protruding fins 24'.

Next, gate spacers 38 are formed on the sidewalls of dummy gate stack 30. In accordance with some embodiments of the present disclosure, gate spacers 38 are formed of a dielectric material such as silicon carbon-oxyitride (SiCN), silicon nitride, or the like, and may have a single-layer structure or a multi-layer structure including a plurality of dielectric layers.

Figure 4:
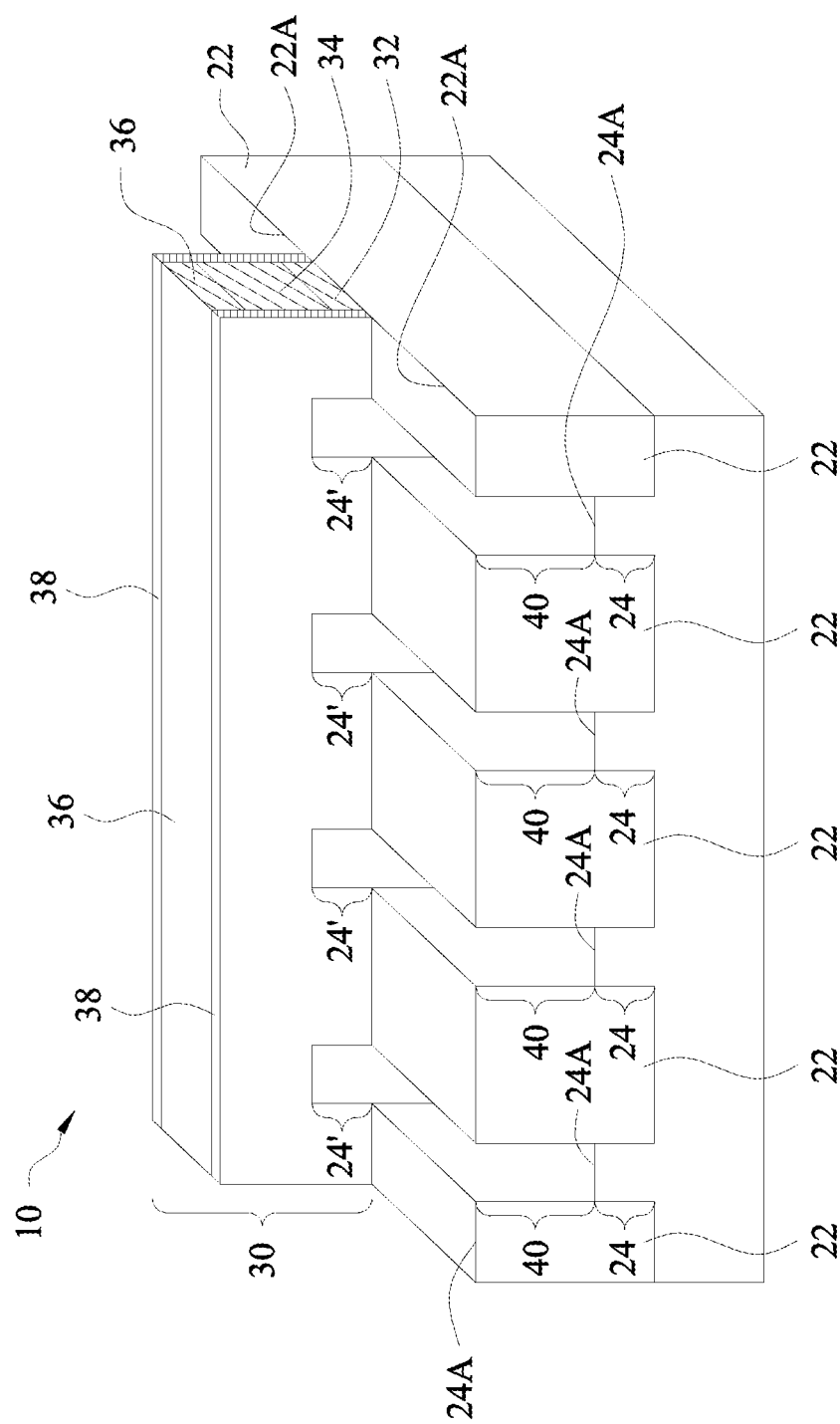

An etching step (referred to as source/drain recessing hereinafter) is then performed to etch the portions of protruding fins 24' that are not covered by dummy gate stack 30 and gate spacers 38, resulting in the structure shown in FIG. 4. The recessing may be anisotropic, and hence the portions of fins 24' directly underlying dummy gate stack 30 and gate spacers 38 are protected, and are not etched. The top surfaces 24A of the recessed semiconductor strips 24 may be lower than the top surfaces 22A of STI regions 22 in accordance with some embodiments. Recesses 40 are accordingly formed between STI regions 22. Recesses 40 are located on opposite sides of dummy gate stack 30.

Figure 5:
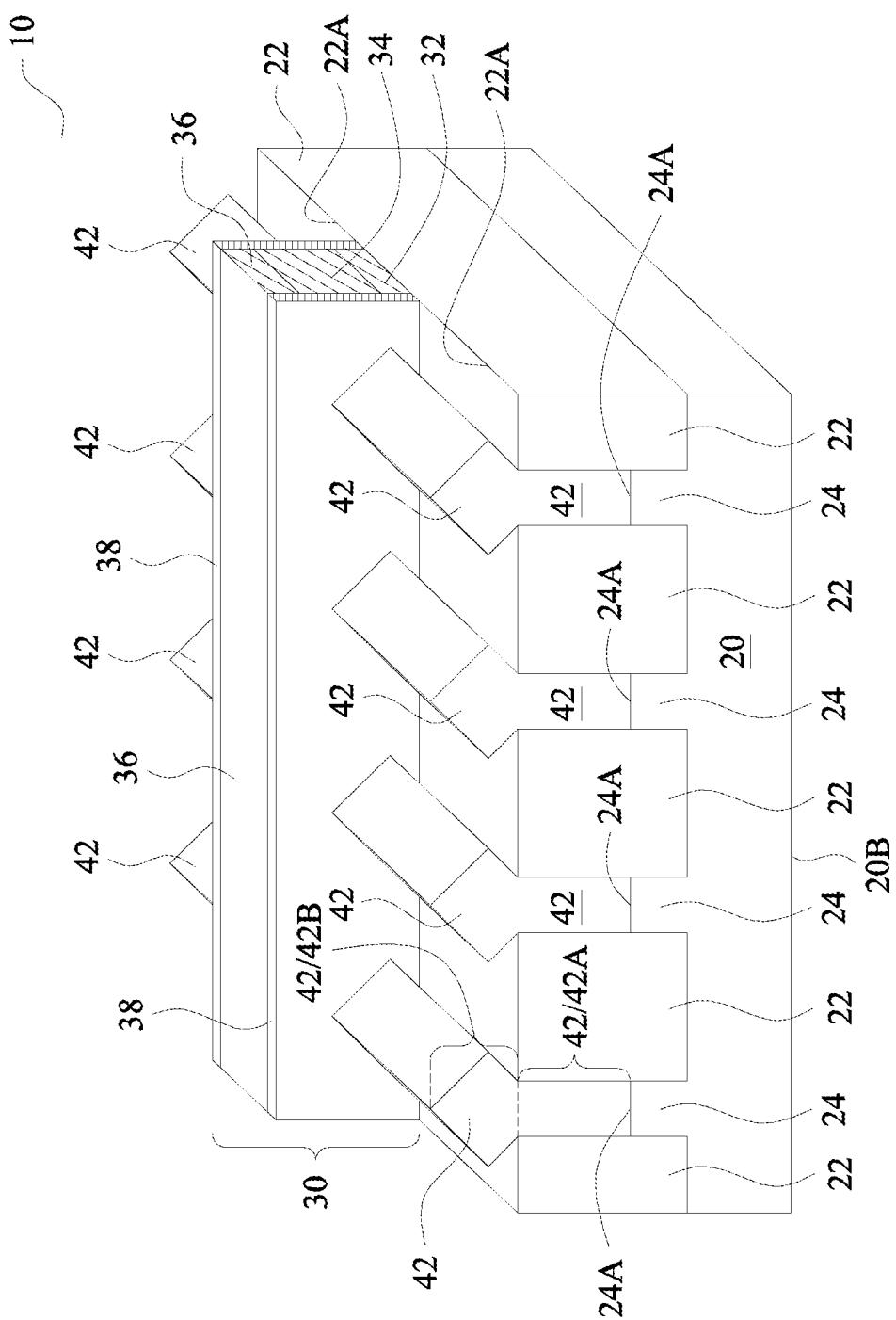

Next, epitaxy regions (source/drain regions) are formed by selectively growing a semiconductor material in recesses 40, resulting in the structure in FIG. 5. In accordance with some exemplary embodiments, epitaxy regions 42 include silicon germanium or silicon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB) may be grown. Conversely, when the resulting FinFET is an n-type FinFET, silicon phosphorous (SiP) or silicon carbon phosphorous (SiCP) may be grown. In accordance with alternative embodiments of the present disclosure, epitaxy regions 42 is formed of a III-V compound semiconductor such as GaAs, InP, GaN, InGaAs, InAlAs, GaSb, AlSb, AlAs, AlP, GaP, combinations thereof, or multi-layers thereof. After epitaxy regions 42 fully fill recesses 40, epitaxy regions 42 start expanding horizontally, and facets may be formed.

After the epitaxy step, epitaxy regions 42 may be further implanted with a p-type or an n-type impurity to form source and drain regions, which are also denoted using reference numeral 42. In accordance with alternative embodiments of the present disclosure, the implantation step is skipped when epitaxy regions 42 are in-situ doped with the p-type or n-type impurity during the epitaxy. Epitaxy regions 42 include lower portions 42A that are formed in STI regions 22, and upper portions 42B that are formed over the top surfaces 22A of STI regions 22. Lower portions 42A, whose sidewalls are shaped by the shapes of recesses 40 (FIG. 4), may have (substantially) straight edges, which may also be substantial vertical edges that are substantial perpendicular to the major surfaces (such as bottom surface 20B) of substrate 20.

Figure 6A:
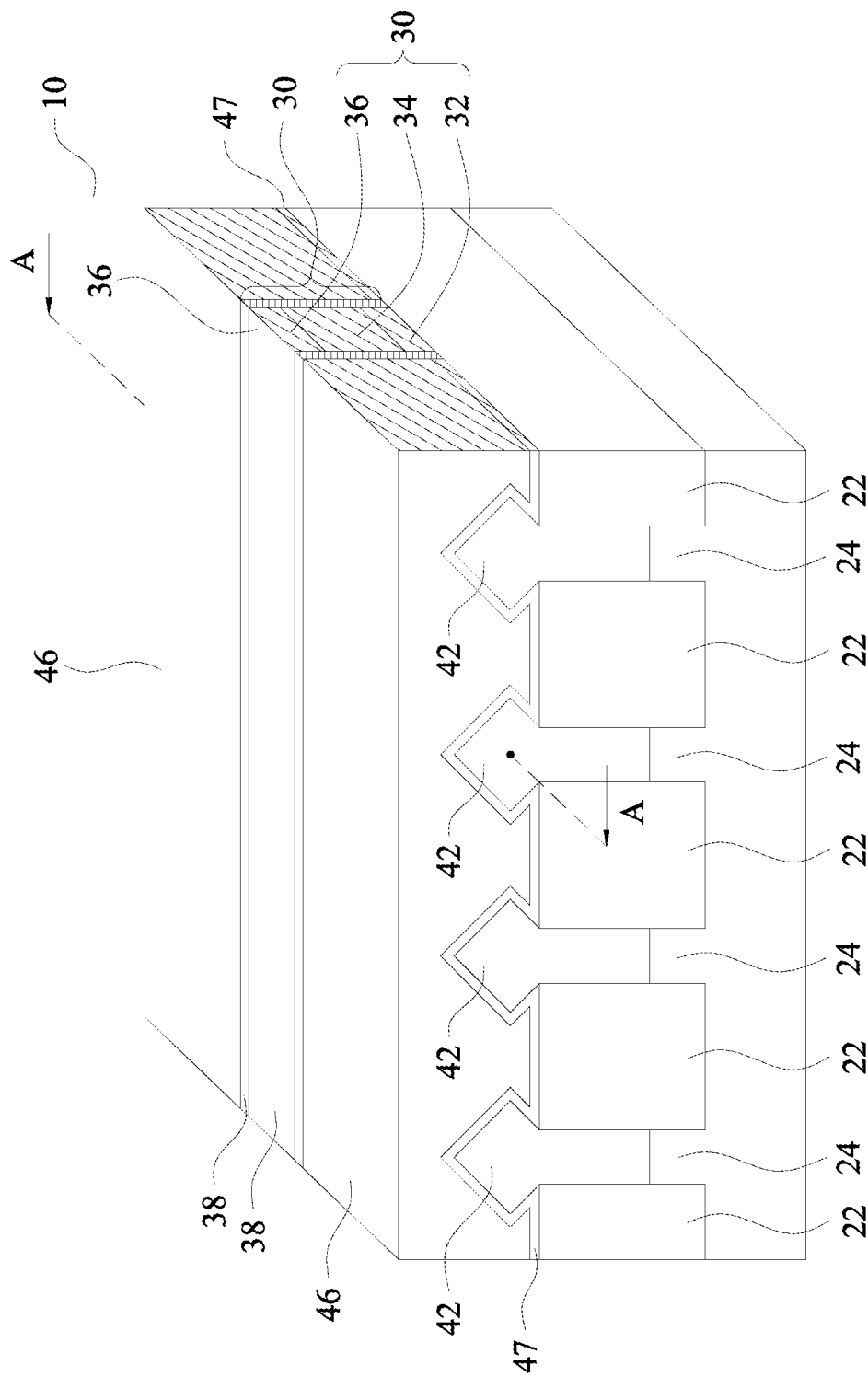

FIG. 6A illustrates a perspective view of the structure with Inter-Layer Dielectric (ILD) 46 being formed. In accordance with some embodiments of the present disclosure, a buffer oxide layer (not shown) and a Contact Etch Stop Layer (CESL) 47 are formed on source and drain regions 42 before the formation of ILD 46. The buffer oxide layer may be formed of silicon oxide, and the CESL 47 may be formed of silicon nitride, silicon carbo-nitride, or the like. The buffer oxide layer and CESL 47 may be formed using a conformal deposition method such as ALD, for example. ILD 46 may include a dielectric material formed using, for example, FCVD, spin-on coating, CVD, or other deposition methods. ILD 46 may also be formed of Tetra Ethyl Ortho Silicate (TEOS) oxide, Plasma Enhanced CVD (PECVD) oxide ($SiO_2$), Phospho-Silicate Glass (PSG), Boro-Silicate Glass (BSG), Boron-Doped Phospho-Silicate Glass (BPSG), or the like. A planarization step such as Chemical Mechanical Polish (CMP) or mechanical grinding may be performed to level the top surfaces of ILD 46, dummy gate stack 30, and gate spacers 38 with each other.

Figure 6B:
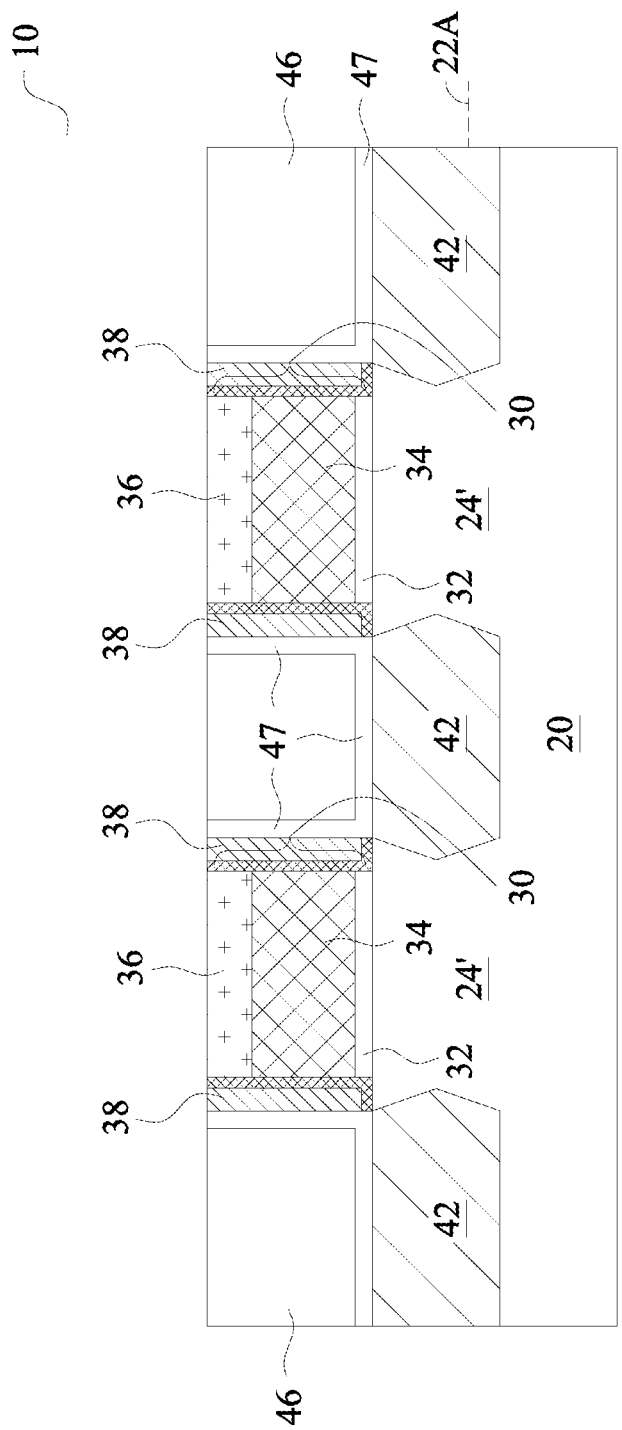

A cross-sectional view of the structure shown in FIG. 6A is illustrated in FIG. 6B, wherein the cross-sectional view is obtained from the vertical plane containing line A-A in FIG. 6A. In the cross-sectional view, two of the plurality of dummy gate stacks 30 are illustrated, and source/drain regions 42 formed between neighboring dummy gate stacks 30 are illustrated. It is appreciated that more dummy gate stacks 30 and source/drain regions 42 may be formed in an alternating layout.

Next, dummy gate stacks 30, which include hard mask layers 36, dummy gate electrodes 34 and dummy gate dielectrics 32 are replaced with replacement gate stacks, which include metal gates and replacement gate dielectrics as shown in FIGS. 7 through 10. The cross-sectional views shown in FIGS. 7 through 10 and the subsequent FIGS. 11 through 21 are obtained from the same vertical plane containing line A-A in FIG. 6A. In FIGS. 7 through 21, the level 22A of the top surfaces of STI regions 22 are illustrated, and semiconductor fins 24' are over level 22A.

Figure 7:
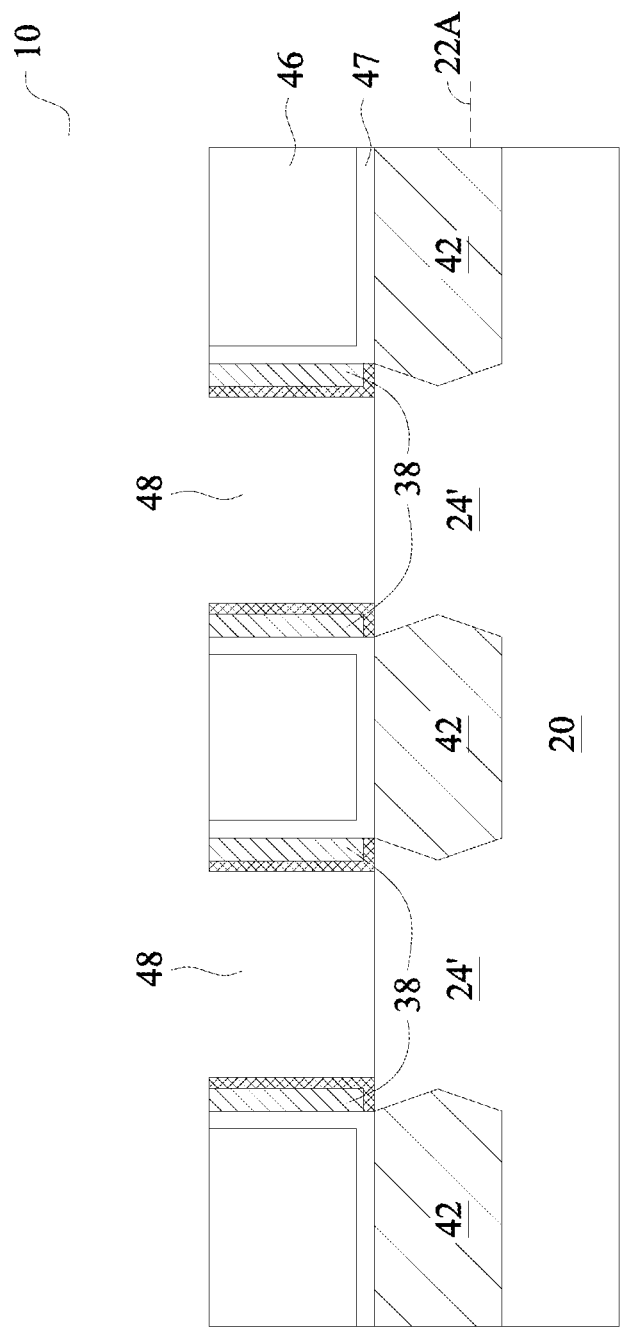

When replacing gate stacks, hard mask layers 36, dummy gate electrodes 34, and dummy gate dielectrics 32 as shown in FIGS. 6A and 6B are first removed in one or a plurality of etching steps, resulting in trenches/openings 48 as shown in FIG. 7. The respective step is illustrated as step 202 in the process flow shown in FIG. 22. The top surfaces and the sidewalls of protruding semiconductor fins 24' are exposed to trenches 48.

Figure 8:
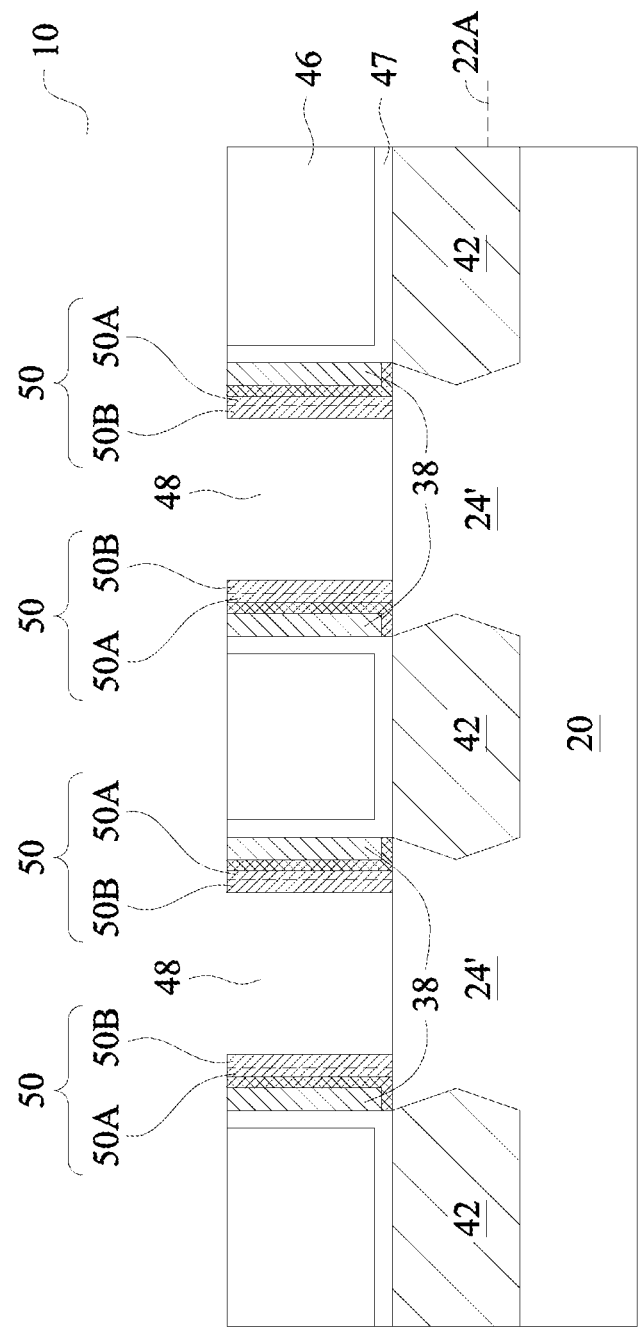

FIG. 8 illustrates the formation of gate spacers 50 in accordance with some embodiments. The respective step is illustrated as step 204 in the process flow shown in FIG. 22. In accordance with alternative embodiments, gate spacers 50 are not formed. To form gate spacers 50, one or more blanket gate spacer layers is formed, for example, using a deposition method such as ALD or CVD. The blanket gate spacer layer is conformal. In accordance with some embodiments of the present disclosure, the gate spacer layer is formed of silicon nitride (SiN), SiC, SiON, Silicon oxy-carbo nitride, silicon oxynitride, or other dielectric materials, which may be the same or different from either one of the materials of gate spacers 38 and the materials of CESL 47 and ILD 46. Gate spacers 50 separate the subsequently formed metal gates farther away from source/drain regions 42, so that the possibility of leakage and electrical shorting between them are reduced.

In accordance with some embodiments, gate spacers 50 are formed of a low-k dielectric material, which may have a dielectric constant (k value) lower than about 3.0. Throughout the description, the k value of silicon oxide (SiO$_2$), which is about 3.9, is used to distinguish low k values from high k values. Accordingly, the k values lower than 3.8 are referred to as low k values, and the respective dielectric materials are referred to as low-k dielectric materials. Conversely, the k values higher than 3.9 are referred to as high k values, and the respective dielectric materials are referred to as high-k dielectric materials. For example, gate spacers 50 may be formed of SiON or SiOCN, which are formed as being porous in order to have the desired low-k value. The formation of the low-k dielectric spacers 50 advantageously reduces the parasitic capacitance between the subsequently formed metal gates and source/drain regions 42. For example, during the deposition of the blanket dielectric layer, porogen may be added, and an anneal is performed subsequent to the deposition to drive out the porogen, so that pores are generated. The k value of SiOCN may also be adjusted by adjusting the percentage of elements (such as carbon) therein. The blanket gate spacer layer is etched in an anisotropic etching to remove horizontal portions, and the remaining vertical portions form gate spacers 50.

Each of gate spacer 50 may be formed of a single layer having a homogenous dielectric material, or may be formed of a plurality of dielectric layers formed of different dielectric materials. For example, gate spacer 50 may include sub-spacer 50A and sub-spacer 50B. The formation process may include depositing a conformal dielectric layer and performing an anisotropic etch to form sub-spacer 50A, and then depositing another conformal dielectric layer and performing another anisotropic etch to form sub-spacer 50B.

In the embodiments in which gate spacers 50 include sub-spacers, either one of sub-spacers 50A and sub-spacers 50B is formed of a low-k dielectric material such as SiON or SiOCN (with pores), and the other sub-layer may be formed of a low-k dielectric material, silicon oxide (which is neither low-k nor high-k), or a high-k dielectric material. Silicon oxide or high-k dielectric materials have good insulating ability. Accordingly, with one of the sub-layers formed of low-k dielectric materials, and the other formed of silicon oxide or a high-k dielectric material, the isolating ability is good, and the parasitic capacitance is also low. In accordance with some embodiments, sub-spacers 50A and 50B are formed of a same material (such as SiON or SiOCN) but have different porosity. For example, sub-spacers 50A may have a higher porosity than sub-spacers 50B, or sub-spacers 50B may have a higher porosity than sub-spacers 50A.

Figure 9:
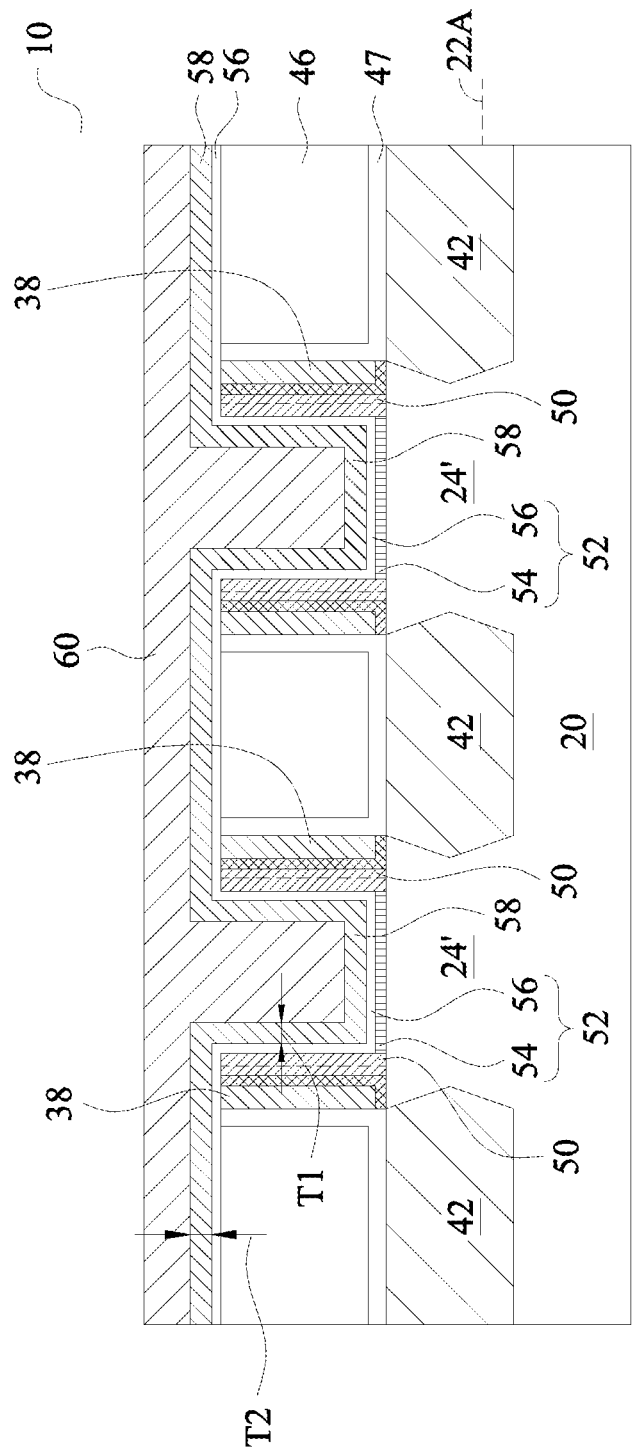

Next, referring to FIG. 9, (replacement) gate dielectric layer 52 is formed, which extend into trenches 48 (FIG. 8). The respective step is illustrated as step 206 in the process flow shown in FIG. 22. In accordance with some embodiments of the present disclosure, gate dielectric layer 52 includes Interfacial Layer (IL) 54 as its lower part. IL 54 is formed on the exposed surfaces of protruding fins 24'. IL 54 may include an oxide layer such as a silicon oxide layer, which is formed through the thermal oxidation of protruding fins 24', a chemical oxidation process, or a deposition process. Gate dielectric layer 52 may also include high-k dielectric layer 56 formed over IL 54. High-k dielectric layer 56 includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. High-k dielectric layer 56 is overlying, and may contact, IL 54. High-k dielectric layer 56 is formed as a conformal layer, and extends on the sidewalls of protruding fins 24' and the top surface and the sidewalls of gate spacers 38/50. In accordance with some embodiments of the present disclosure, high-k dielectric layer 56 is formed using ALD or CVD.

Referring further to FIG. 9, stacked layers 58 are deposited. The respective step is illustrated as step 208 in the process flow shown in FIG. 22. The sub-layers in stacked layers 58 are not shown separately, while in reality, the sub-layers are distinguishable from each other. The deposition may be performed using a conformal deposition method such as ALD or CVD, so that thickness T1 of the vertical portions and thickness T2 of the horizontal portions of stacked layers 58 (and each of sub-layers) are substantially equal to each other. Stacked layers 58 extend into trenches 48 (FIG. 8), and include some portions over ILD 46.

Stacked layers 58 may include a diffusion barrier layer and one (or more) work-function layer over the diffusion barrier layer. The diffusion barrier layer may be formed of titanium nitride (TiN), which may (or may not) be doped with silicon. The work-function layer determines the work function of the gate, and includes at least one layer, or a plurality of layers formed of different materials. The specific material of the work-function layer is selected according to whether the respective FinFET is an n-type FinFET or a p-type FinFET. For example, when the FinFET is an n-type FinFET, the work-function layer may include a TaN layer and a titanium aluminum (TiAl) layer over the TaN layer. When the FinFET is a p-type FinFET, the work-function layer may include a TaN layer, a TiN layer over the TaN layer, and a TiAl layer over the TiN layer. After the deposition of the work-function layer(s), another barrier layer, which may be another TiN layer, is formed.

Figure 10:
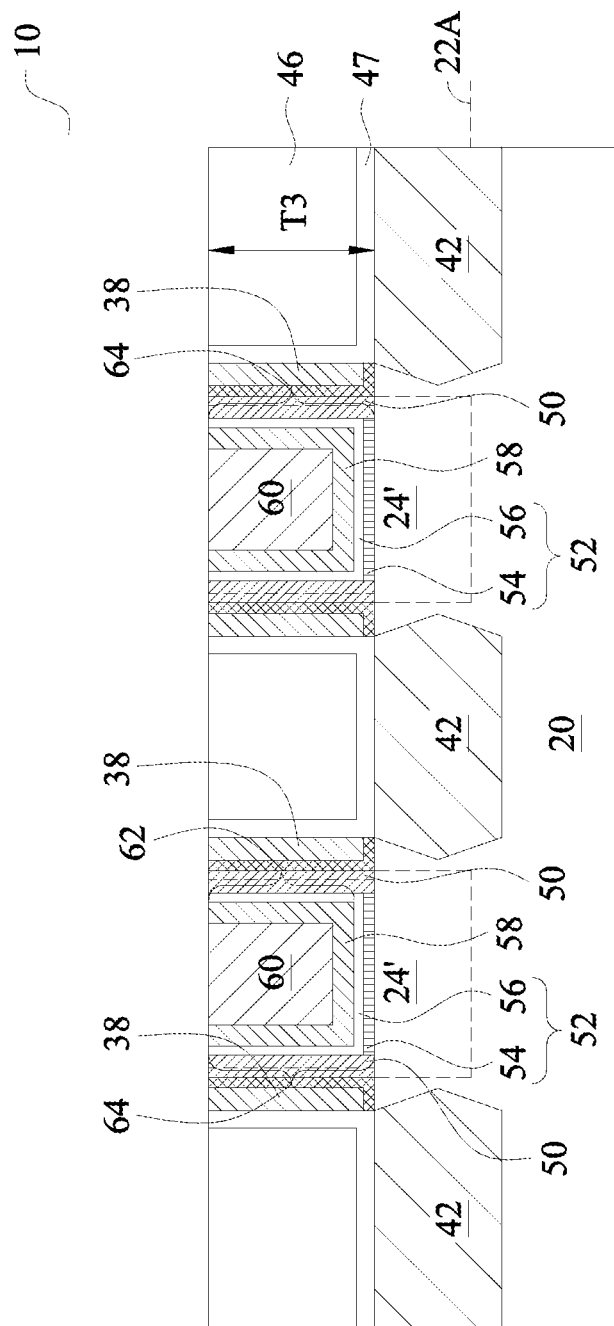

Next, metallic material 60 is deposited, which may be formed of tungsten or cobalt, for example. Metallic material 60 fully fills remaining trenches 48 (FIG. 8). In a subsequent step as shown in FIG. 10, a planarization step such as CMP or mechanical grinding is performed, so that the portions of layers 56, 58, and 60 over ILD 46 are removed. The respective step is illustrated as step 210 in the process flow shown in FIG. 22. As a result, metal gate electrodes 62 are formed, which include the remaining portions of layers 58 and 60. The remaining portion of layers 52, 58, and 60 are referred to as replacement gate stacks 64 hereinafter. As shown in FIG. 10, the top surfaces of metal gate 62, spacers 38/50, CESL 47, and ILD 46 may be substantially coplanar at this time. The thickness T3 of ILD 46 and CESL 47 may be in the range between about 15 nm and about 25 nm.

In FIG. 10, dashed lines (marked as 64/50) are illustrated as aligned to the outer edges of gate spacers 50 to show that gate spacers 50 and replacement gate stacks 64 extend below the illustrated top surfaces of semiconductor fins 24', and extend onto the sidewalls of semiconductor fins 24'. The dashed lines indicate that these portions of gate spacers 50 and replacement gate stacks 64 are not in the illustrated plane. Also, although not shown, gate spacers 38 also extend onto the sidewalls of semiconductor fins 24', as shown in FIG. 3.

FIGS. 11 through 20 illustrate the formation of source/drain contact plugs and gate contact plugs. In the illustrated example, three source/drain regions 42 are shown, and the illustrated process only shows the formation of the three source/drain contact plug connected to the leftmost source/drain regions. In actual process, there may also be source/drain contact plugs formed to connect to the center and rightmost source/drain regions 42. These source/drain contact plugs, however, are formed in different planes than illustrated, and hence are not visible. Similarly, there may be a gate contact plug formed directly over the left gate stack 64, which is in a different plane than illustrated, and hence is not shown.

Figure 11:
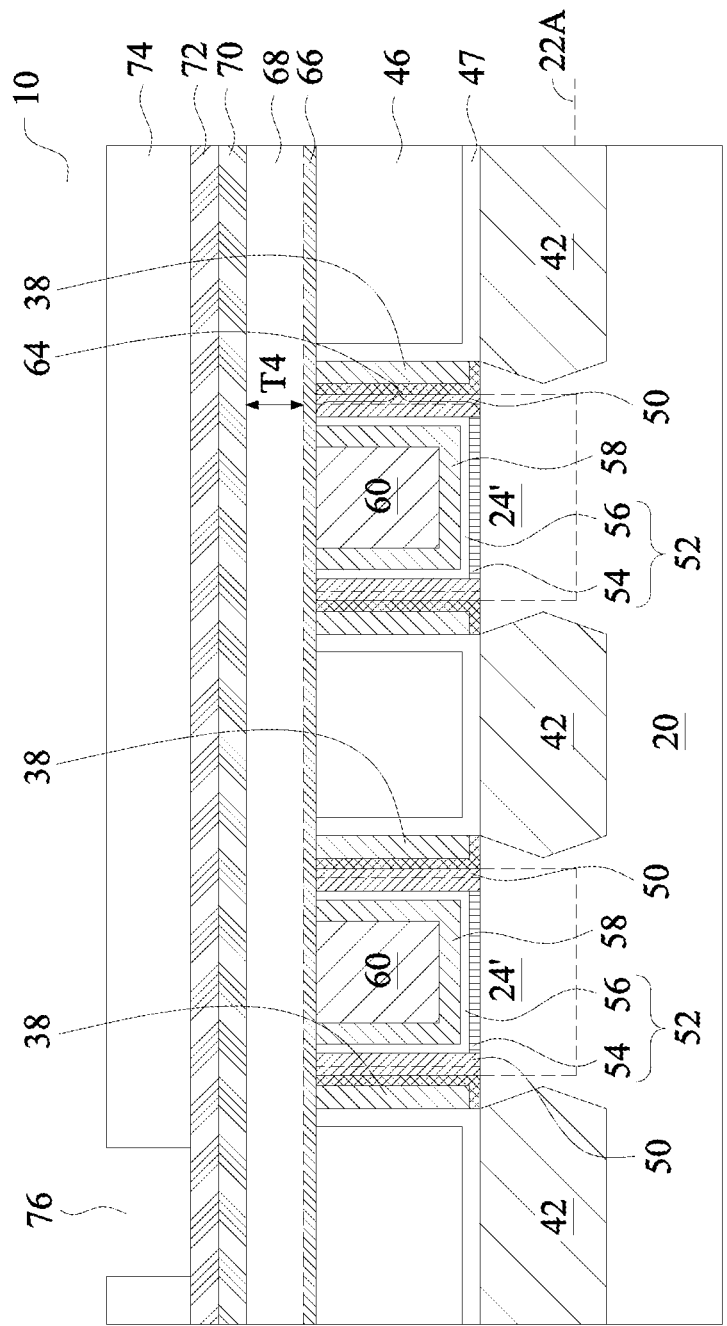
Figure 14:
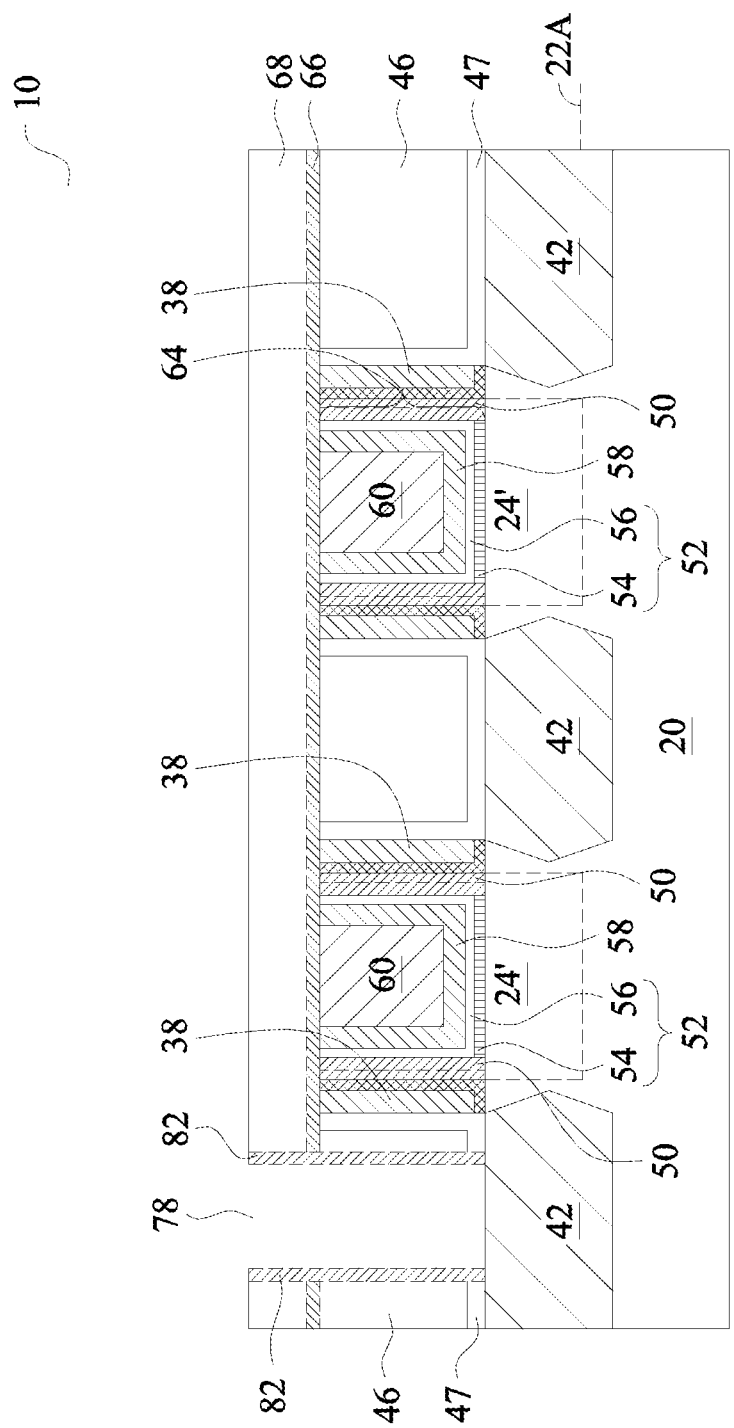

Referring to FIG. 11, in accordance with some embodiments of the present disclosure, dielectric mask 66 is formed. Between the planarization for forming gate electrodes 62 and the formation of dielectric mask 66, no etch-back is performed to recess gate electrodes 62. Dielectric layer 66 may be formed of a high-k dielectric material with a k value higher than 3.9. In accordance with some embodiments of the present disclosure, dielectric mask 66 is formed of $Al_xO_y$, $HfO_2$, SiN, or SiOCN (with no pores or substantially no pores inside). Dielectric layer 66 may (or may not) also be formed of a same material (such as SiOCN) as gate spacers 50, with gate spacers 50 being more porous than dielectric mask 66 in order to have a low k value. The thickness of dielectric mask 66 may be in the range between about 2 nm and about 4 nm. The formation method may include PECVD, ALD, CVD, or the like. Next, ILD 68 is formed over dielectric mask 66. ILD 68 has a k value higher than the k value of the low-k dielectric material in gate spacers 50, and lower than the k value of subsequently formed contact spacers 82 (FIG. 14). The material of ILD 68 may be selected from the same candidate materials (and methods) for forming ILD 46, and ILDs 46 and 68 may be formed of the same or different dielectric materials. For example, dielectric layer 68 may be formed using PECVD, and may include silicon oxide ($SiO_2$). Thickness T4 of dielectric layer 68 may be in the range between about 700 Å and about 800 Å.

In according with alternative embodiments of the present disclosure, dielectric mask 66 is not formed, and ILD 68 is in direct contact with the underlying replacement gate stacks 64, gate spacers 38/50, CESL 47, and ILD 46. Accordingly, dielectric mask 66 is illustrated using dashed lines to indicate it is formed optionally. In these embodiments, between the planarization for forming gate electrodes 62 and the formation of ILD 68, no etch-back is performed to recess gate electrodes 62.

Metal hard mask 70, which is used as an etching mask in subsequent etching, is then formed over ILD 68. Metal hard mask 70 may be formed of a metal nitride such as titanium nitride. Pad oxide layer 72, which may be formed of silicon oxide, is then formed over hard mask layer 70. Photo resist 74 is then applied and patterned, forming opening 76.

Figure 12:
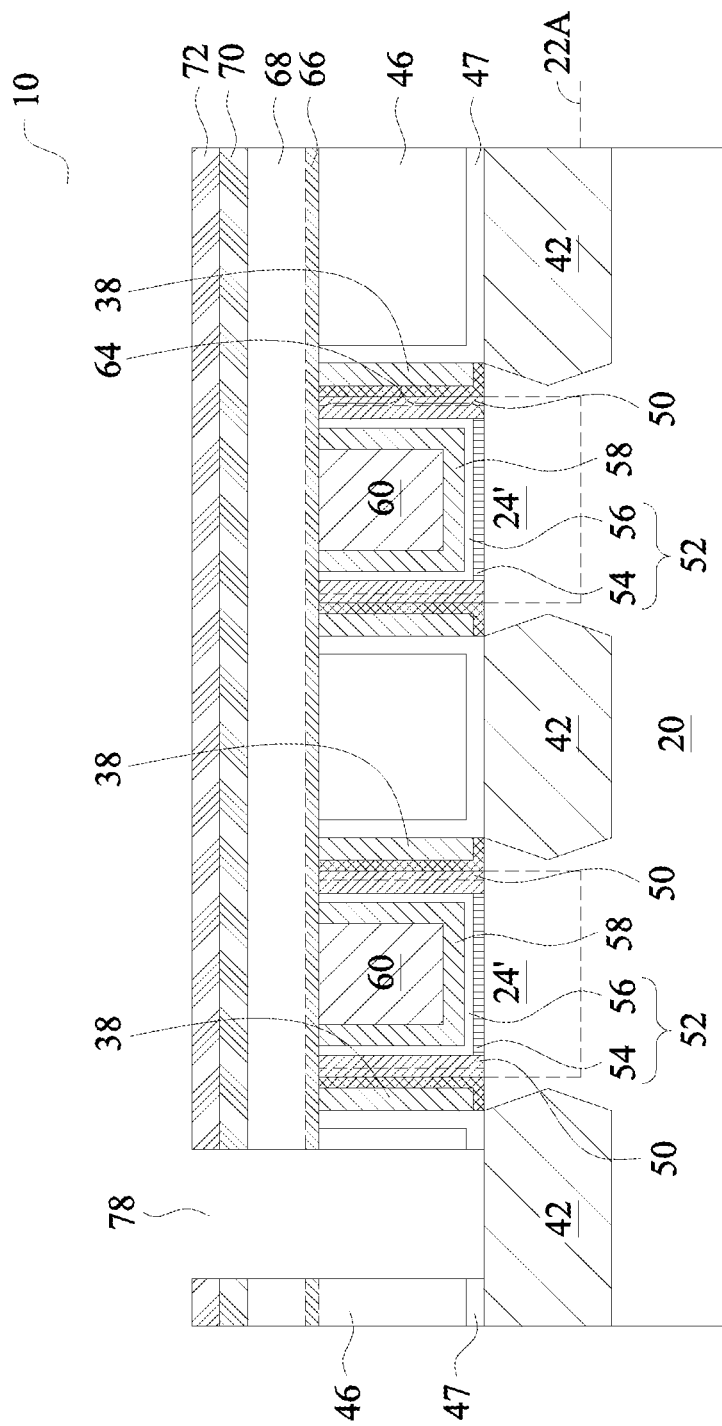

The patterned photo resist 74 is then used to etch the underlying pad oxide layer 72 and metal hard mask 70, so that opening 76 extends into metal hard mask 70. Next, photo resist 74 is removed, for example, in an ashing process. The remaining pad oxide layer 72 and metal hard mask 70 are then used as an etching mask to etch ILD 68, dielectric mask 66 (if any), ILD 46, and CESL 47, so that source/drain contact opening 78 is formed, as shown in FIG. 12. The respective step is illustrated as step 212 in the process flow shown in FIG. 22. During this etching process, dielectric mask 66 (if formed) is not used as an etching stop layer. Accordingly, the etching of ILD 68, dielectric mask 66, and ILD 46 may be performed in a single continuous etching process using an etching gas attacking all of ILD 68, dielectric mask 66, and ILD 46. CESL 47 may be used as an etching stop layer in the etching of layers 68, 66, and 46. The etching process is then changed, for example, using a different etching gas, and the exposed portion of CESL 47 is etched, exposing the underlying source/drain region 42.

Figure 13:
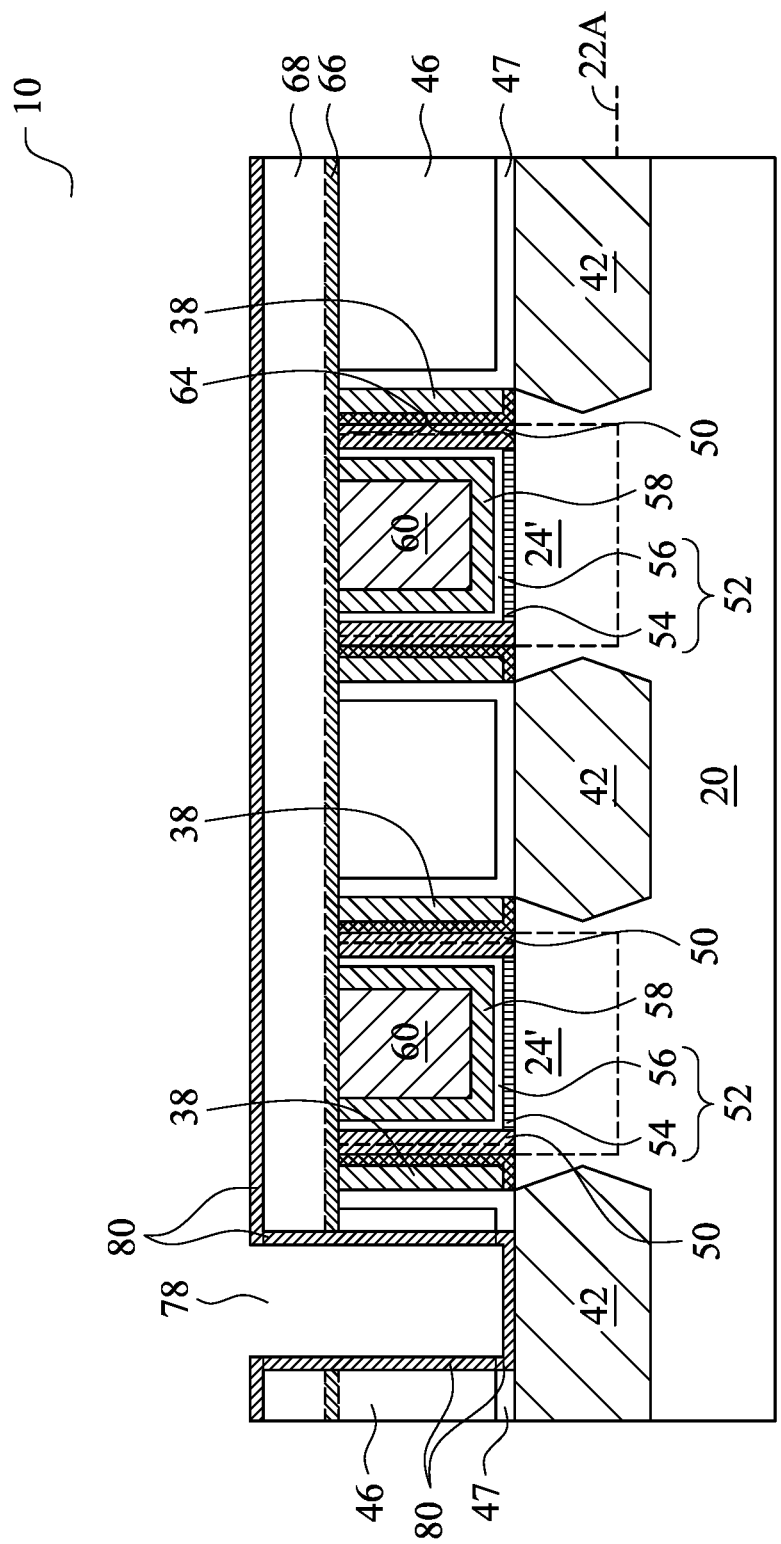

Referring to FIG. 13, dielectric layer 80 is formed, for example, using a conformal deposition method such as CVD or ALD. Dielectric layer 80 may be a high-k dielectric layer with a k value greater than 3.9, so that it has good isolation ability. The candidate materials include $Al_xO_y$, $HfO_2$, SiN, and SiOCN (with no pores or substantially no pores inside). The thickness of dielectric layer 80 may be in the range between about 2 nm and about 4 nm.

An anisotropic etch is then performed, so that the horizontal portions of dielectric layer 80 are removed, and the remaining vertical portions on the sidewalls of opening 78 form contact spacer 82, which forms a ring when viewed from the top of wafer 10. The resulting structure is shown in FIG. 14. The respective step is illustrated as step 214 in the process flow shown in FIG. 22.

Figure 16:
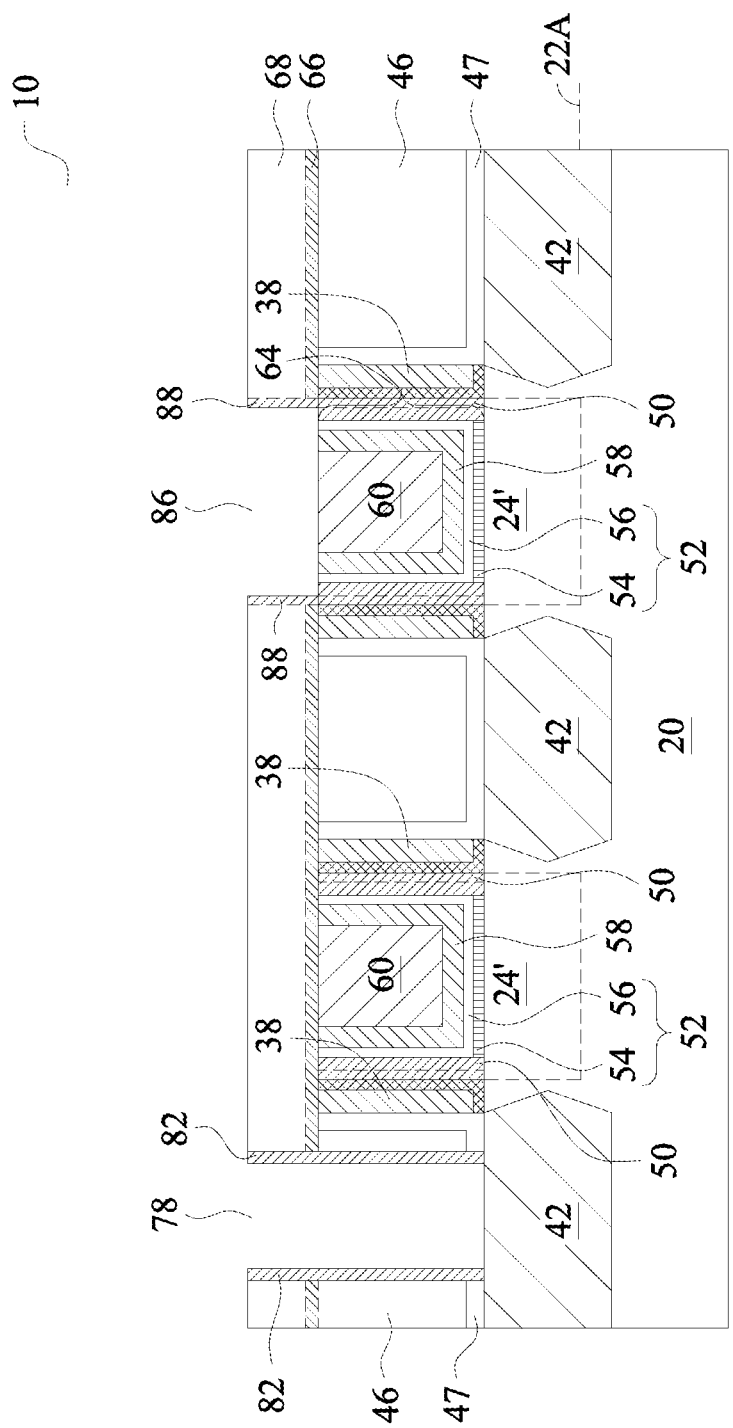

In accordance with alternative embodiments of the present disclosure, rather than forming contact spacer 82 at this stage, contact spacer 82 may be formed simultaneously as contact spacer 88 in the step shown in FIG. 16. Accordingly, in FIG. 14, contact spacer 82 is illustrated as being dashed to indicate it may or may not be formed at this time.

Figure 15:
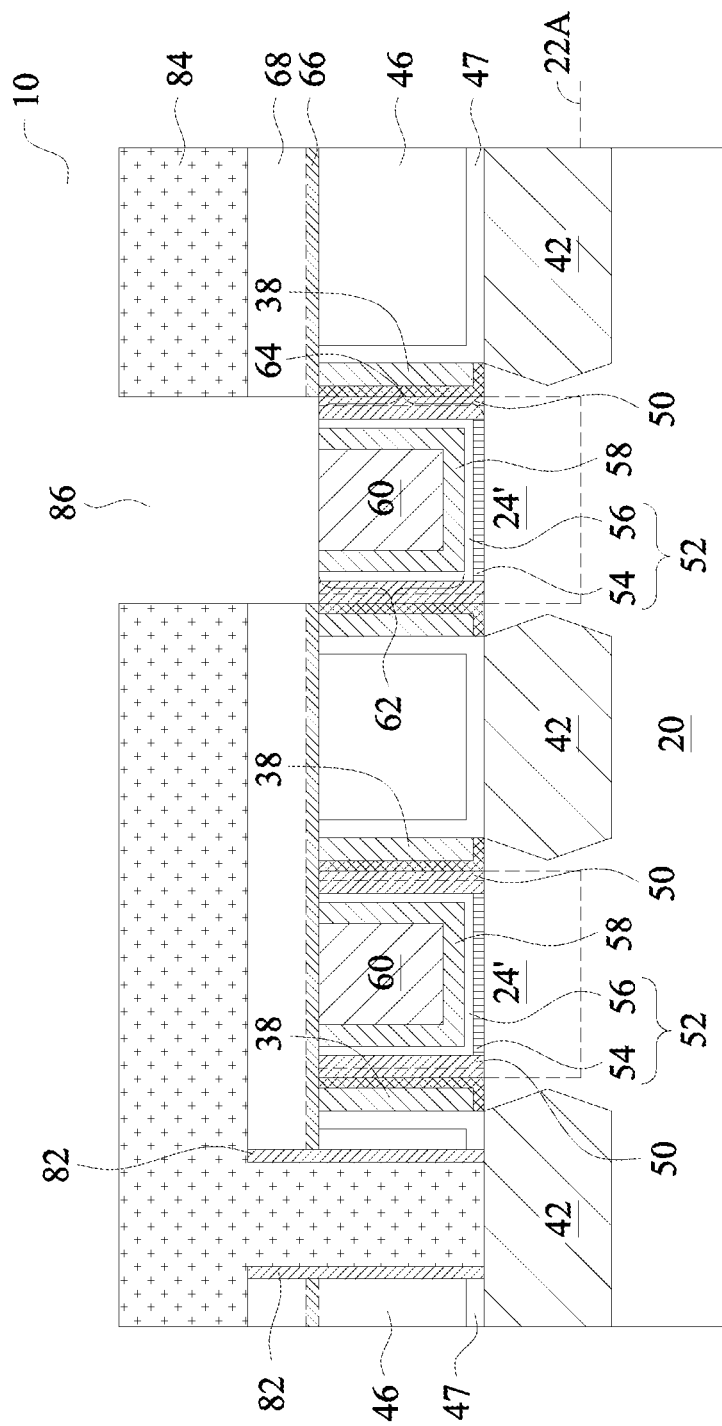

Referring to FIG. 15, photo resist 84 is applied and patterned to form an opening therein. Next, ILD 68 and dielectric mask 66 are etched to extend the opening down and to form gate contact opening 86, through which gate electrode 62 is exposed. The respective step is illustrated as step 216 in the process flow shown in FIG. 22. Gate contact opening 86 may be wide enough, so that gate spacers 38/50 are exposed. Gate contact opening 86 may also be smaller than illustrated, and gate spacers 50/38 are not exposed. Photo resist 84 is then removed.

Next, as shown in FIG. 16, (gate) contact spacer 88 is formed on the sidewalls of opening 86 in accordance with some embodiments. In accordance with alternative embodiments, contact spacer 88 is not formed. When contact spacer 82 has already been formed in preceding steps, contact spacer 88 may not be formed. If contact spacer 82 hasn't been formed in preceding steps, contact spacers 82 and 88 are formed simultaneously in the step shown in FIG. 16. Contact spacer 88 may be formed of a high-k dielectric material, which may be selected from the same group of candidate materials for forming contact spacer 82 (and corresponding dielectric layer 80). Accordingly, contact spacer 88 is illustrated as dashed to indicate it may or may not be formed, and contact spacer 82 is illustrated as solid to indicate it has been formed. In accordance with alternative embodiments, contact opening 86 is formed prior to the formation of contact opening 78, and hence contact spacer 88 is formed, while contact spacer 82 is formed optionally.

Figure 17:
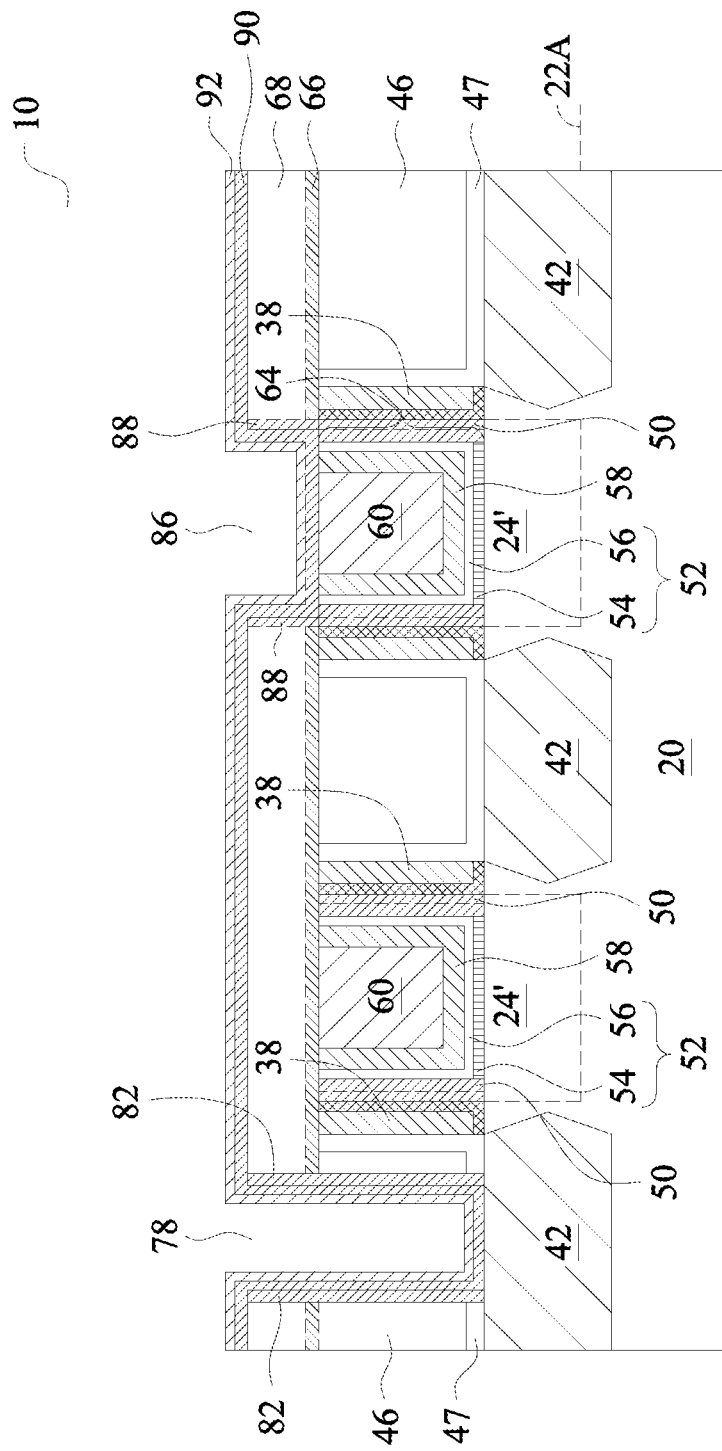

Referring to FIG. 17, metal layer 90 (such as a titanium layer or a cobalt layer) is deposited, for example, using PVD. Barrier layer 92, which may be a metal nitride layer such as a titanium nitride layer or a tantalum nitride layer is then formed over metal layer 90. The respective step is illustrated as step 218 in the process flow shown in FIG. 22. Barrier layer 92 may be formed using CVD. Layers 90 and 92 are both conformal, and extend into openings 78 and 86.

Figure 18:
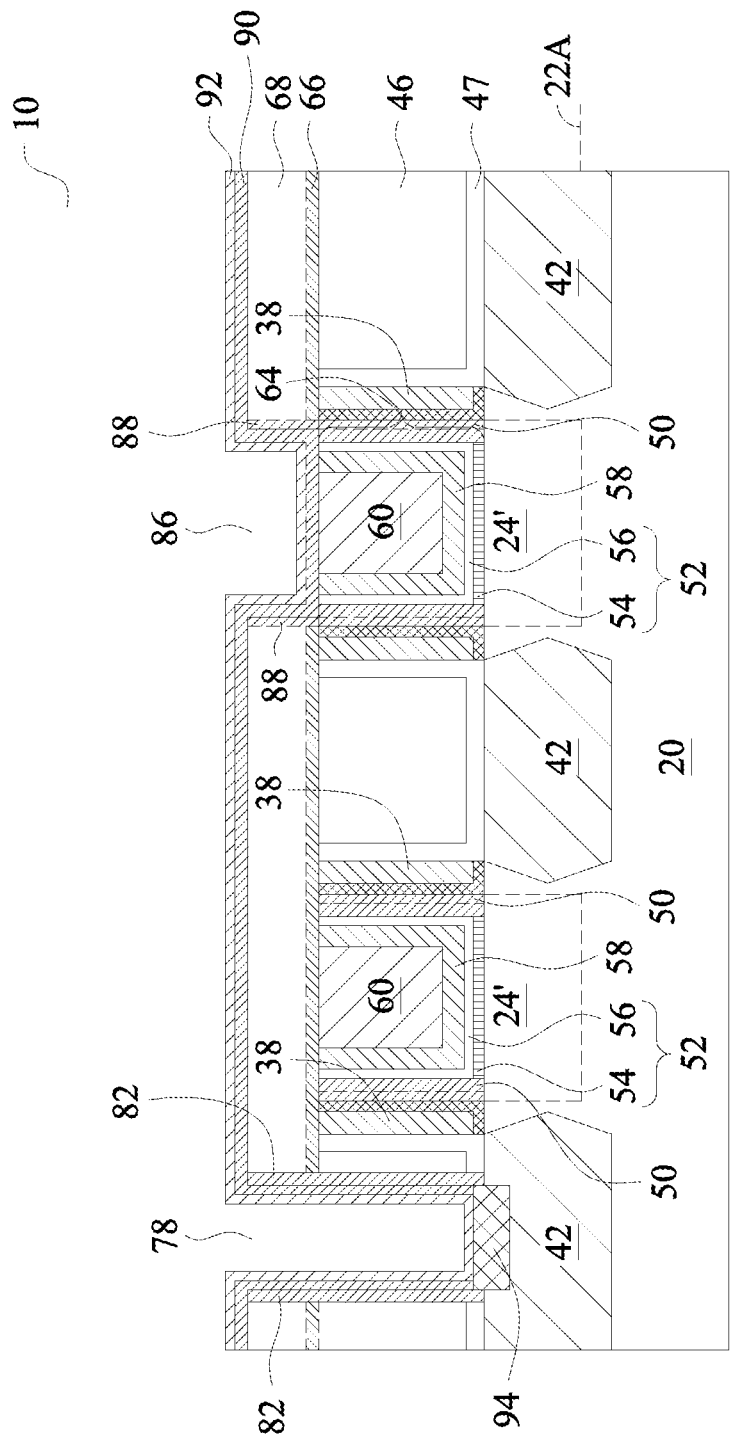

An anneal is then performed to form source/drain silicide region 94, as shown in FIG. 18. The respective step is illustrated as step 220 in the process flow shown in FIG. 22. The anneal may be performed through Rapid Thermal Anneal (RTA), furnace anneal, or the like. Accordingly, the bottom portion of metal layer 90 reacts with source/drain region 42 to form silicide region 94. The sidewall portions of metal layer 90 remain after the silicidation process. In accordance with some embodiments of the present disclosure, the top surface of silicide region 94 is in contact with the bottom surface of barrier layer 92.

Figure 19:
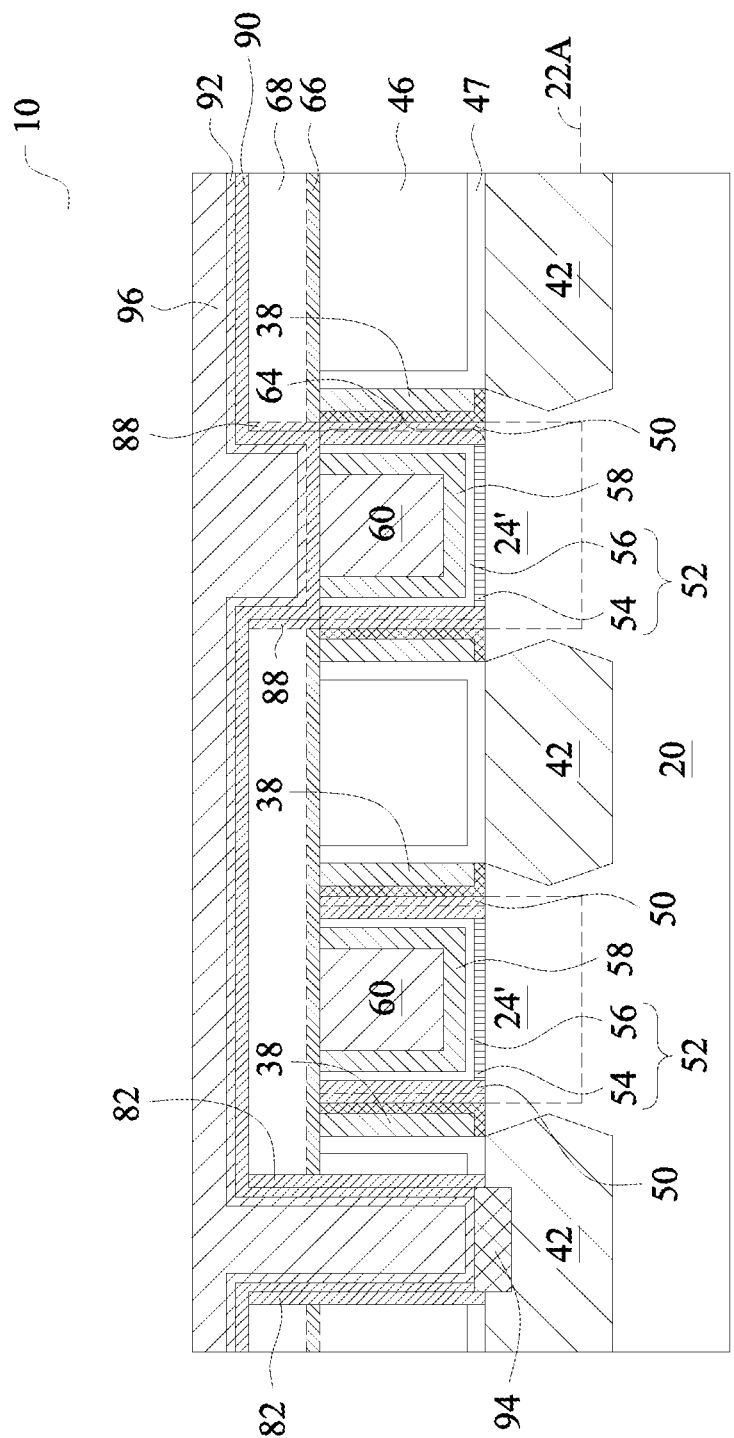
Figure 20:
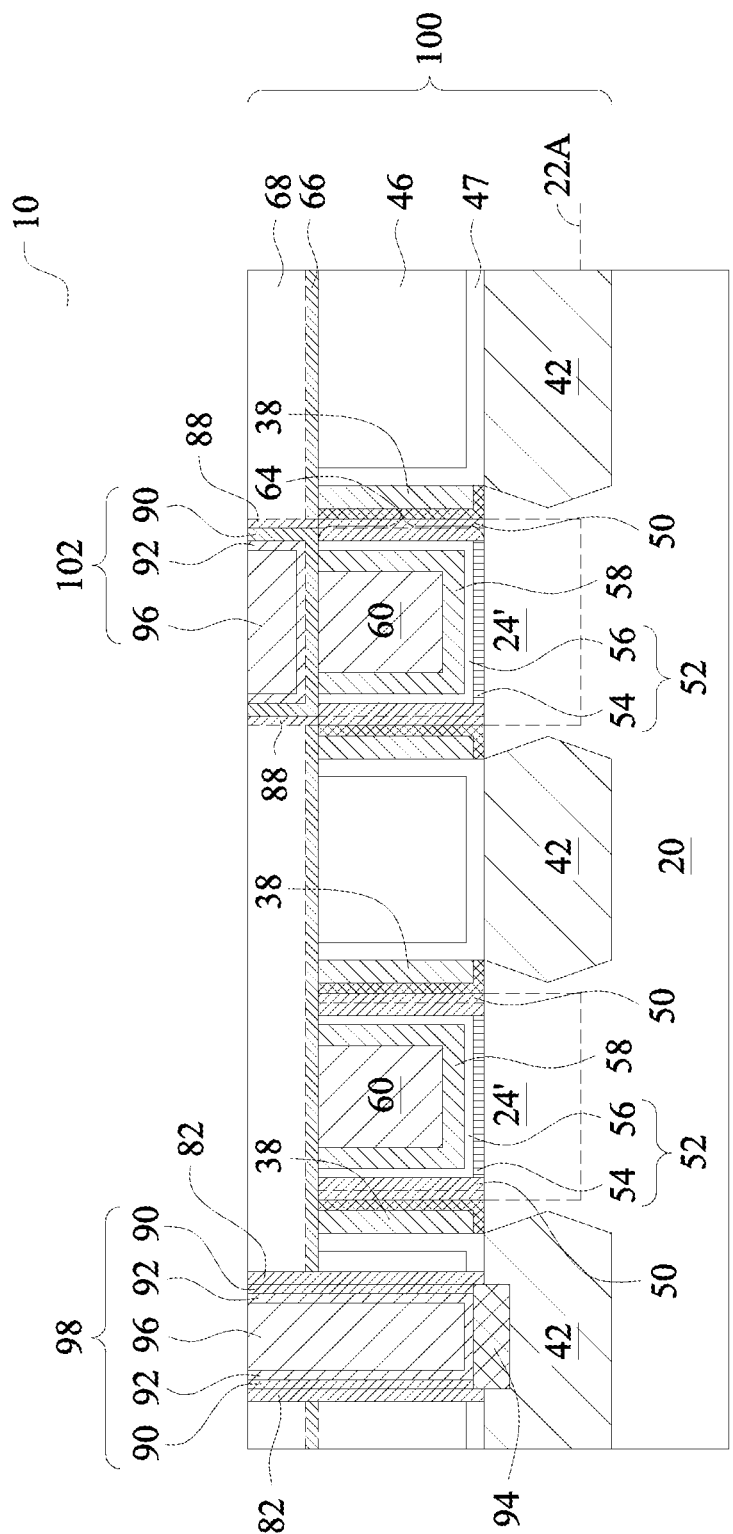

Next, as shown in FIG. 19, metallic material 96 is deposited over and in contact with barrier layer 92. The respective step is illustrated as step 222 in the process flow shown in FIG. 22. Metallic material 96 may be selected from the same group of candidate materials of metal-containing material 60, and may include tungsten or cobalt. A planarization step such as CMP or mechanical grinding is then performed to remove the portions of layers 90, 92, and 96 over ILD 68. The resulting structure is shown in FIG. 20, which includes source/drain contact plug 98 and gate contact plug 102.

Figure 21:
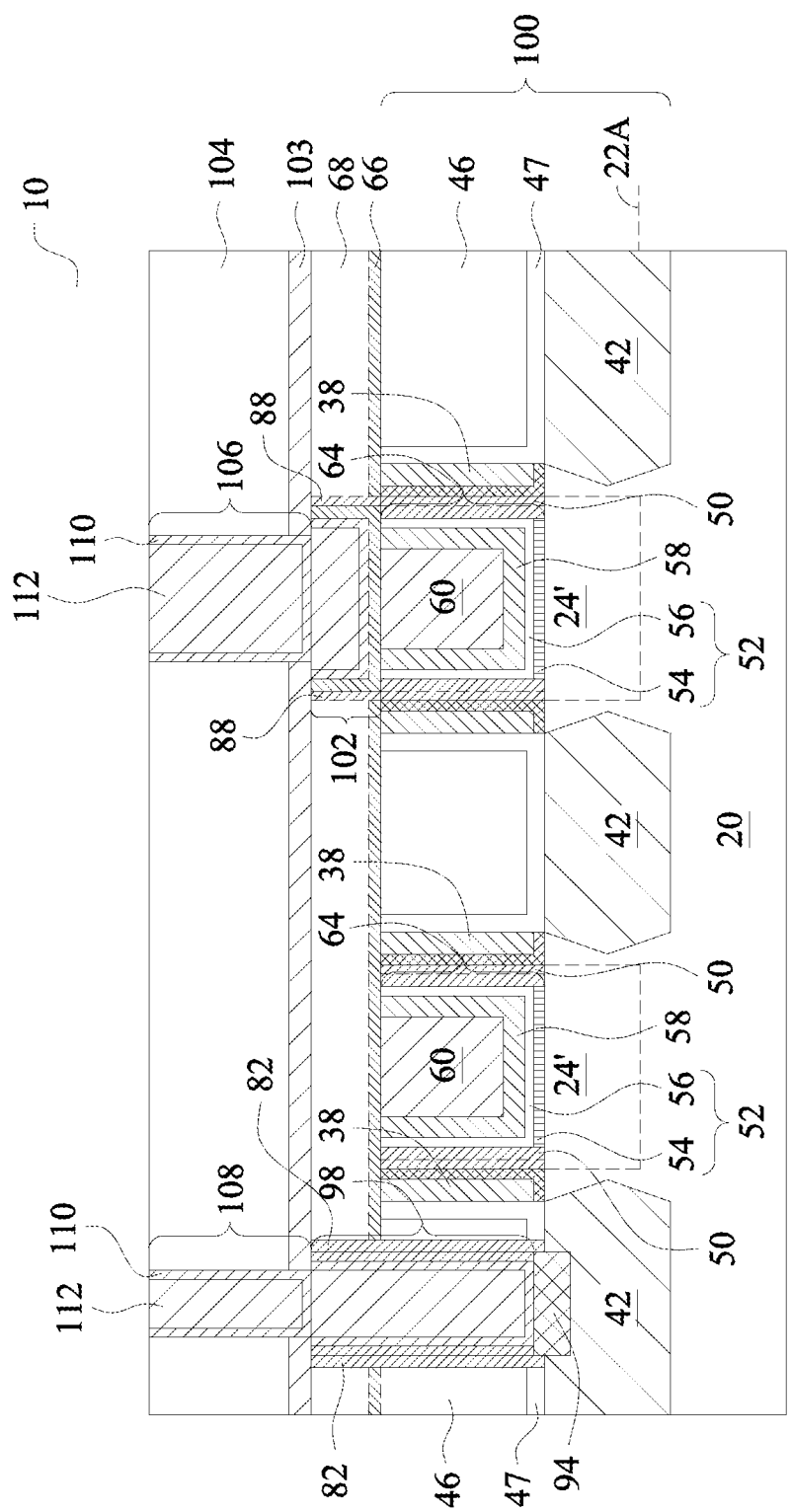
Figure 22:
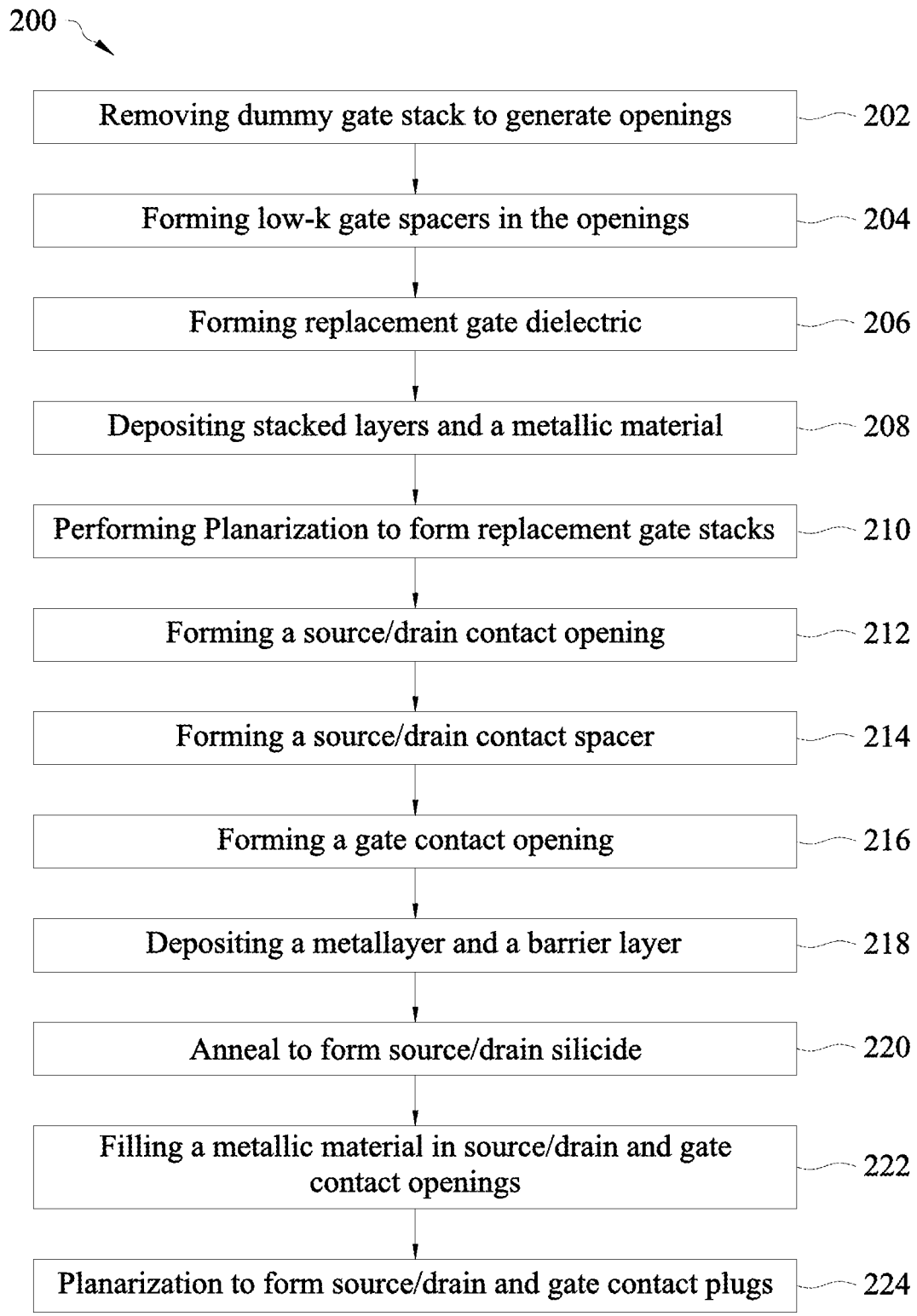
FIG. 22 illustrates a process flow for forming a transistor and contact plugs in accordance with some embodiments.

FIG. 21 illustrates the formation of etch stop layer 103, dielectric layer 104, gate contact plug (via) 106, and source/drain contact plug (via) 108 in etch stop layer 103 and dielectric layer 104. Etch stop layer 103 may be formed of silicon carbide, silicon oxynitride, silicon carbo-nitride, or the like, and may be formed using a deposition method such as CVD. Dielectric layer 104 may include a material selected from PSG, BSG, BPSG, Fluorine-doped Silicon Glass (FSG), TEOS oxide, or PECVD oxide ($SiO_2$). Dielectric layer 104 may be formed using spin coating, FCVD, or the like, or formed using a deposition method such as PECVD or Low Pressure Chemical Vapor Deposition (LP-CVD).

Dielectric layer 104 and etch stop layer 103 are etched to form openings (occupied by plugs/vias 106 and 108). The etching may be performed using, for example, Reactive Ion Etch (RIE). In a subsequent step, plugs/vias 106 and 108 are formed. In accordance with some embodiments of the present disclosure, plugs/vias 106 and 108 include barrier layer 110 and metal-containing material 112 over barrier layer 110. In accordance with some embodiments of the present disclosure, the formation of plugs/vias 106 and 108 includes etching layers 103 and 104 to form contact openings, forming a blanket barrier layer and a metal-containing material over the blanket barrier layer, and performing a planarization to remove excess portions of the blanket barrier layer and the metal-containing material. Barrier layer 110 may be formed of a metal nitride such as titanium nitride or tantalum nitride. The material, the structure, and the formation methods of metal-containing material 112 may be selected from the candidate materials, the candidate structures, and the candidate formation methods, respectively, of metal-containing material 60, and hence the details are not repeated herein.

In the resulting structure, the source regions in source/drain regions 42 may be electrically interconnected, the drain regions in source/drain regions 42 may be electrically interconnected, and gate electrodes 64 may be interconnected through contact plugs and overlying plugs/vias, metal lines (not shown), so that the resulting structure forms FinFET 100.

The embodiments of the present disclosure have some advantageous features. After the formation of metal gate electrode 62, the metal gate electrode is not etched back, and no hard mask is formed in the resulting recess. Accordingly, the cost for etching-back and forming hard mask is saved. The height of the metal gate is also reduced since it doesn't need to be etched back. Accordingly, the aspect ratio of the opening for filling the metal gate is reduced, and the filling of metal gate is easier. The formation of the high-k contact spacers 82/88 and the high-k dielectric mask 66 improves the isolation between the metal gate and the adjacent source/drain contact plugs. The formation of the low-k gate spacers improves the isolation between the metal gate and the source/drain regions without causing the increase in the parasitic capacitance.

In accordance with some embodiments of the present disclosure, a method includes forming a transistor, which includes forming a source/drain region on a side of a dummy gate, forming a first ILD covering the source/drain region, removing the dummy gate to form a trench in the first ILD, forming a gate dielectric layer extending into the trench, forming a metallic material over the gate dielectric layer, and performing a planarization to remove excess portions of the gate dielectric layer and the metallic material to form a gate dielectric and a metal gate, respectively. The method further includes forming a second ILD over the first ILD and the metal gate. At a time the second ILD is formed, a top surface of the metal gate is coplanar with a top surface of the first ILD. The method further includes forming a source/drain contact plug electrically coupling to the source/drain region, wherein the source/drain contact plug penetrates through both the first ILD and the second ILD, and forming a gate contact plug over and in contact with the metal gate.

In accordance with some embodiments of the present disclosure, a method includes forming a transistor, which includes forming a dummy gate stack over a semiconductor region, and forming an ILD. The dummy gate stack is in the ILD, and the ILD covers a source/drain region in the semiconductor region. The method further includes removing the dummy gate stack to form a trench in the first ILD, forming a low-k gate spacer in the trench, forming a replacement gate dielectric extending into the trench, forming a metal layer to fill the trench, and performing a planarization to remove excess portions of the replacement gate dielectric and the metal layer to form a gate dielectric and a metal gate, respectively. A source region and a drain region are then formed on opposite sides of the metal gate.

In accordance with some embodiments of the present disclosure, a device includes a first ILD, a first gate spacer in the first ILD, a gate dielectric in an opening located between opposite portions of the first gate spacer, and a metal gate over the gate dielectric. A top surface of the metal gate, a top end of the first gate spacer, and a top surface of the first ILD are in contact with a bottom surface of a same overlying dielectric layer. The device further includes a second ILD over the first ILD, a source/drain region adjacent to the metal gate, and a source/drain contact plug over and electrically coupling to the source/drain region. The source/drain contact plug penetrates through both the first ILD and the second ILD. A contact spacer encircles the source/drain contact plug.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
    forming a transistor comprising:

forming a source/drain region on a side of a dummy gate, wherein the dummy gate is over a semiconductor region;
forming a first Inter-Layer Dielectric (ILD) covering the source/drain region;
removing the dummy gate to form a trench in the first ILD;
forming a gate dielectric and a metal gate in the trench;
forming a second ILD over the first ILD and the metal gate;
forming a source/drain contact plug electrically coupling to the source/drain region, the forming the source/drain contact plug comprises:
  etching the second ILD and the first ILD to form a source/drain contact opening;
  forming a contact spacer in the source/drain contact opening, wherein the forming the contact spacer comprises forming a high-k dielectric spacer;
  forming a source/drain silicide region on the source/drain region; and
  filling the source/drain contact opening with a metallic material to form the source/drain contact plug, wherein the contact spacer encircles the source/drain contact plug, and a first sidewall of the contact spacer forms a vertical interface with a second sidewall of the source/drain silicide region; and
forming a gate contact plug over and in contact with the metal gate.

2. The method of claim 1 further comprising, after the dummy gate is removed and before forming the gate dielectric and the metal gate, forming gate spacers in the trench forming low-k dielectric spacers.

3. The method of claim 2, wherein at a time after the gate spacers are formed and before the metallic material is formed, a top surface of the semiconductor region is exposed.

4. The method of claim 1, wherein the second ILD is over and contacting the first ILD.

5. The method of claim 1 further comprising forming a dielectric mask in contact with the metal gate and the first ILD, wherein the second ILD is over and contacting the dielectric mask.

6. The method of claim 5, wherein the filling the metallic material comprises:
depositing a metal layer having a portion extending into the source/drain contact opening;
depositing a metal nitride barrier layer over the metal layer; and
performing a planarization to remove excess portions of the metal layer and the metal nitride barrier layer.

7. The method of claim 5, wherein the forming the dielectric mask comprises forming a high-k dielectric layer.

8. The method of claim 1, wherein the high-k dielectric spacer comprises a material selected from the group consisting of $Al_xO_y$, $HfO_2$, SiN, and SiOCN.

9. The method of claim 1, wherein a thickness of the high-k dielectric spacer is in a range between 2 nm and 4 nm.

10. A method comprising:
forming a transistor comprising:
  forming a dummy gate stack over a semiconductor region;
  forming a first Inter-Layer Dielectric (ILD), wherein the dummy gate stack is in the first ILD, and the first ILD covers a source/drain region in the semiconductor region;
  removing the dummy gate stack to form a trench in the first ILD;
  forming a low-k gate spacer in the trench, wherein the low-k gate spacer comprises a low-k dielectric material having a first k value lower than a second k value of silicon oxide;
  forming a replacement gate dielectric extending into the trench;
  forming a metal layer to fill the trench;
  performing a planarization to remove excess portions of the replacement gate dielectric and the metal layer to form a gate dielectric and a metal gate, respectively; and
  forming a source region and a drain region, wherein the source region and the drain region are on opposite sides of the metal gate;
etching the first ILD to form a source/drain contact opening;
forming a dielectric contact spacer in the source/drain contact opening; and
forming a source/drain silicide region over the source/drain region, wherein a first sidewall of the dielectric contact spacer forms a vertical interface with a second sidewall of the source/drain silicide region.

11. The method of claim 10 further comprising, before the dummy gate stack is removed and before the first ILD is formed, forming an additional gate spacer contacting a sidewall of the dummy gate stack, wherein the low-k gate spacer has a sidewall contacting a sidewall of the additional gate spacer.

12. The method of claim 10, wherein the low-k gate spacer is formed of a homogeneous dielectric material that extends from a top surface of the ILD to contact a top surface of the semiconductor region.

13. The method of claim 10 further comprising:
forming a high-k dielectric mask over and contacting the metal gate, the low-k gate spacer, and the first ILD; and
forming a second ILD over and contacting the high-k dielectric mask.

14. The method of claim 10 further comprising:
forming a source/drain contact plug in the source/drain contact opening, wherein the dielectric contact spacer encircles the source/drain contact plug.

15. A method comprising:
forming a dummy gate stack over a semiconductor region;
forming a first gate spacer on a sidewall of the dummy gate stack;
after the first gate spacer is formed, forming an Inter-Layer Dielectric (ILD) embedding the dummy gate stack;
removing the dummy gate stack to form a recess in the ILD;
forming a replacement gate stack in the recess;
forming a gate contact plug in contact with a top surface of the replacement gate stack;
etching the ILD to form a source/drain contact opening;
forming a dielectric contact spacer in the source/drain contact opening;
forming a source/drain silicide region; and
forming a source/drain contact plug, wherein the dielectric contact spacer encircles the source/drain contact plug, and the dielectric contact spacer extends lower than a top surface of the source/drain silicide region.

16. The method of claim 15 further comprising:
forming a second gate spacer in the recess and contacting the first gate spacer, wherein the replacement gate stack contacts the second gate spacer.

17. The method of claim 16, wherein the second gate spacer is formed of a low-k dielectric material having a dielectric constant lower than a dielectric constant of silicon oxide.

18. The method of claim 15 further comprising depositing high-k dielectric hard mask over and contacting the replacement gate stack and the ILD.

19. The method of claim 18, wherein no recessing is performed on the replacement gate stack during a period of time starting from a first time the dummy gate stack is replaced by the replacement gate stack and ending at a second time the high-k dielectric hard mask is started.

20. The method of claim 15, wherein a sidewall of the dielectric contact spacer forms a vertical interface with a sidewall of the source/drain silicide region.

* * * * *